(12) United States Patent
Kim et al.

(10) Patent No.: US 9,378,987 B2
(45) Date of Patent: Jun. 28, 2016

(54) SEMICONDUCTOR PACKAGES INCLUDING GAP IN INTERCONNECTION TERMINALS AND METHODS OF MANUFACTURING THE SAME

(71) Applicants: Jungwoo Kim, Osan-si (KR); Jingyu Kim, Asan-si (KR)

(72) Inventors: Jungwoo Kim, Osan-si (KR); Jingyu Kim, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/712,330

(22) Filed: May 14, 2015

(65) Prior Publication Data

US 2016/0043057 A1 Feb. 11, 2016

(30) Foreign Application Priority Data

Aug. 5, 2014 (KR) .................... 10-2014-0100635

(51) Int. Cl.
*H01L 21/56* (2006.01)
*H01L 25/00* (2006.01)
(Continued)

(52) U.S. Cl.
CPC .............. *H01L 21/565* (2013.01); *H01L 21/52* (2013.01); *H01L 21/56* (2013.01); *H01L 23/3107* (2013.01); *H01L 23/3128* (2013.01); *H01L 25/105* (2013.01); *H01L 25/162* (2013.01); *H01L 25/50* (2013.01); *H05K 7/023* (2013.01); *H01L 24/11* (2013.01); *H01L 24/81* (2013.01); *H01L 2224/16227* (2013.01); *H01L 2224/32225* (2013.01); *H01L 2224/48091* (2013.01); *H01L 2224/48227* (2013.01); *H01L 2224/73265* (2013.01); *H01L 2225/1023* (2013.01);
(Continued)

(58) Field of Classification Search
CPC .............. H01L 23/3128; H01L 21/565; H01L 23/49816; H01L 21/563; H01L 25/0657; H01L 23/28; H01L 24/81; H01L 21/52; H01L 25/162; H01L 25/04; H01L 21/56; H01L 23/3107; H01L 24/11; H05K 7/023
See application file for complete search history.

(56) References Cited

U.S. PATENT DOCUMENTS 6,940,176 B2    9/2005  Chen
8,106,495 B2 *  1/2012  Kajiki .................. H01L 21/565
                                                        257/678

(Continued)

FOREIGN PATENT DOCUMENTS

JP    2000-91463 A    3/2000
JP    2010-278070 A   12/2010

(Continued)

Primary Examiner — Alonzo Chambliss
(74) Attorney, Agent, or Firm — Myers Bigel & Sibley, P.A.

(57) ABSTRACT

A semiconductor package includes a lower package comprising a lower semiconductor chip mounted on a lower package substrate, an upper package comprising an upper package substrate stacked on the lower package and an upper semiconductor chip mounted on the upper package substrate, interconnection terminals electrically connecting the lower package substrate with the upper package substrate, and a lower molding film molding the lower semiconductor chip between the lower package substrate and the upper package substrate. The lower package substrate comprises a chip region on which the lower semiconductor chip is mounted, an interconnection region enclosing a portion of the chip region, and a mold injection region defined by the chip region and the interconnection region. The interconnection terminals are disposed on the lower package substrate of the interconnection region but not disposed on the lower package substrate of the mold injection region.

18 Claims, 19 Drawing Sheets

(51) Int. Cl.
*H01L 23/31* (2006.01)
*H05K 7/02* (2006.01)
*H01L 25/16* (2006.01)
*H01L 21/52* (2006.01)
*H01L 25/10* (2006.01)
*H01L 23/00* (2006.01)

(52) U.S. Cl.
CPC ............... *H01L2225/1058* (2013.01); *H01L 2924/15311* (2013.01); *H01L 2924/15331* (2013.01); *H01L 2924/1815* (2013.01); *H01L 2924/18161* (2013.01)

(56) References Cited

U.S. PATENT DOCUMENTS

| | | | |
|---|---|---|---|
| 8,400,779 | B2 | 3/2013 | Kim et al. |
| 8,604,614 | B2 | 12/2013 | Kwon et al. |
| 8,653,640 | B2 | 2/2014 | Kim et al. |
| 8,823,180 | B2 | 9/2014 | Wang et al. |
| 9,029,998 | B2 * | 5/2015 | Jang ............... H01L 23/34 257/686 |
| 2010/0148332 | A1 * | 6/2010 | Kajiki ............... H01L 21/565 257/678 |
| 2012/0326306 | A1 | 12/2012 | Lee |
| 2013/0299970 | A1 | 11/2013 | Harada et al. |
| 2014/0084416 | A1 * | 3/2014 | Kang ............... H01L 25/105 257/532 |
| 2014/0353821 | A1 * | 12/2014 | Yu ............... H01L 24/17 257/737 |

FOREIGN PATENT DOCUMENTS

| | | |
|---|---|---|
| JP | 2011-155169 A | 8/2011 |
| JP | 2012-114349 A | 6/2012 |
| KR | 20-2011-0076604 A | 7/2011 |
| KR | 10-2012-0133651 A | 12/2012 |

* cited by examiner

SEMICONDUCTOR PACKAGES INCLUDING GAP IN INTERCONNECTION TERMINALS AND METHODS OF MANUFACTURING THE SAME

CROSS-REFERENCE TO RELATED APPLICATION

This U.S. non-provisional patent application claims priority under 35 U.S.C. §119 of Korean Patent Application No. 10-2014-0100635, filed on Aug. 5, 2014, the entire contents of which are hereby incorporated by reference.

BACKGROUND

The present disclosure herein relates to semiconductor packages and methods of manufacturing the same, and more particularly, to package-on-package type semiconductor packages and methods of manufacturing the same.

In the semiconductor industry, as demands for high capacity, thin shape and miniaturization for semiconductor devices and electronic products using them increase, various related package techniques emerge one after another. One of them is a package technique for vertically stacking various semiconductor chips to implement a high density chip stack. This technique may integrate semiconductor chips having various functions on a smaller area than that of a typical package having one semiconductor chip.

However, the package technique for stacking a plurality of semiconductor chips may have a relatively high possibility to reduce yield compared to packaging with one semiconductor chip. A so-called package-on-package (POP) technique has been proposed for stacking a package on a package as a technique for implementing a high density chip stack while reducing the yield reduction issue.

The POP technique may reduce a failure occurrence rate in end products since each semiconductor package may be a qualified product that has passed prescribed tests. This POP type semiconductor package may be used, for example, for satisfying miniaturization of electronic mobile devices and function diversification of mobile products.

SUMMARY

Embodiments of the inventive concepts provide semiconductor packages comprising: a lower package comprising a lower semiconductor chip on a lower package substrate; an upper package comprising an upper package substrate on the lower package and on the lower semiconductor chip opposite the lower package substrate, and an upper semiconductor chip on the upper package substrate opposite the semiconductor chip. Interconnection terminals electrically connect the lower package substrate with the upper package substrate. A lower molding film molds the lower semiconductor chip between the lower package substrate and the upper package substrate. The lower package substrate comprises a chip region between the lower semiconductor chip and the lower package substrate, an interconnection region outside of and enclosing a portion of the chip region, and a mold injection region defined by the chip region and the interconnection region. The interconnection terminals are on the lower package substrate of the interconnection region but not on the lower package substrate of the mold injection region.

In other embodiments of the inventive concepts, methods of manufacturing a semiconductor package comprise: providing a lower package comprising a lower package substrate, a lower semiconductor chip on the lower package substrate through lower chip bumps, and lower solder balls disposed on the lower package substrate outside the lower semiconductor chip. A lower molding film is formed, molding the lower semiconductor chip on the lower package substrate. An upper package is also provided, comprising an upper package substrate, an upper semiconductor chip on the upper package substrate; and upper solder balls disposed on a bottom surface of the upper package substrate. The lower solder balls and the upper solder balls are fused to form interconnection terminals electrically connecting the lower package substrate with the upper package substrate. The lower package substrate comprises a chip region on which the lower semiconductor chip is mounted, an interconnection region outside of an enclosing a portion of the chip region, and a mold injection region defined by the chip region and the interconnection region. The lower solder balls are on the lower package substrate of the interconnection region but are not on the lower package substrate of the mold injection region.

In still other embodiments of the inventive concepts, a semiconductor package comprises a first package substrate, a first semiconductor chip on the first package substrate, a second package substrate on the first semiconductor chip opposite the first package substrate and a second semiconductor chip on the second package substrate opposite the first semiconductor chip. An array of interconnection terminals extend outside and around the first semiconductor chip from the first package substrate to the second package substrate. The array of interconnection terminals include a gap therein that is configured to provide a passageway for mold solution to flow from outside the first semiconductor chip to between the first semiconductor chip and the first package substrate.

In some embodiments, the gap in the array of interconnection terminals is further configured to substantially prevent mold solution that flows from outside the first semiconductor chip to between the first semiconductor chip and the first package substrate in a first direction from also substantially flowing from outside the first semiconductor chip to between the first semiconductor chip and the first package substrate in a second direction that is opposite the first direction.

In some embodiments, the gap in the array of interconnection terminals is further configured to substantially prevent mold solution that flows from outside the first semiconductor chip to between the first semiconductor chip and the first package substrate in a first direction and perpendicular to the first direction from also substantially flowing from outside the first semiconductor chip to between the first semiconductor chip and the first package substrate in a second direction that is opposite the first direction.

In some embodiments, the gap in the array of interconnection terminals is further configured to prevent formation of a void in the mold solution that flows from outside the first semiconductor chip to between the first semiconductor chip and the first package substrate.

In some embodiments, the first semiconductor chip comprises a plurality of edges and at least one of the edges is devoid of a gap adjacent thereto.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings:

FIG. 13A through FIG. 17A represent manufacturing methods of a semiconductor package according to embodiments of the inventive concepts and are cross-sectional views taken along a line I-I' of FIG. 1.

FIG. 13B through FIG. 17B represent manufacturing methods of a semiconductor package according to embodiments of the inventive concepts and are cross-sectional views taken along a line IV-IV' of FIG. 1;

DETAILED DESCRIPTION OF THE EMBODIMENTS

Figure 1:
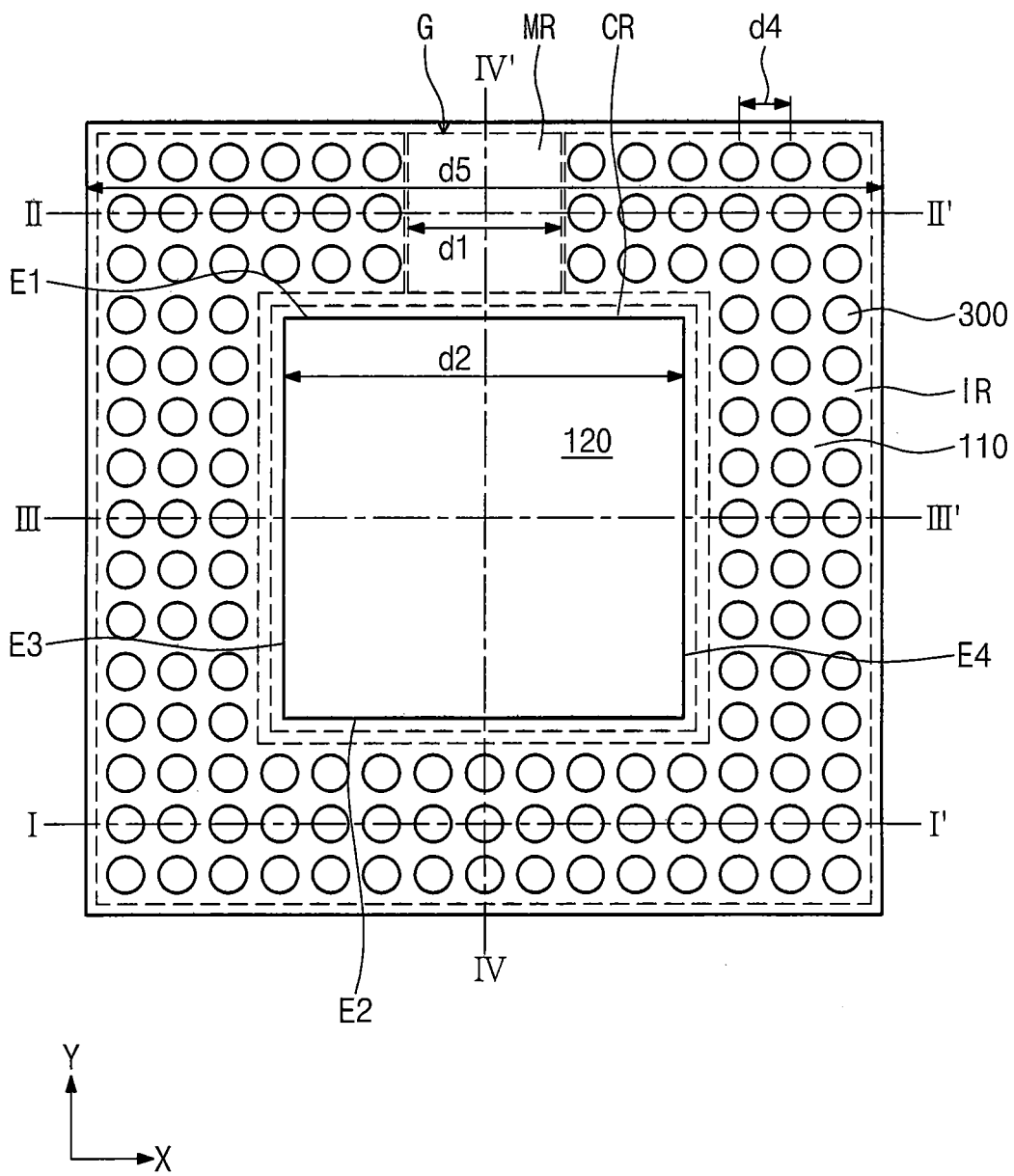
FIGS. 1, 6, and 8 through 11 are respective plan views of semiconductor packages according to first through sixth embodiments of the inventive concepts.
Figure 2:
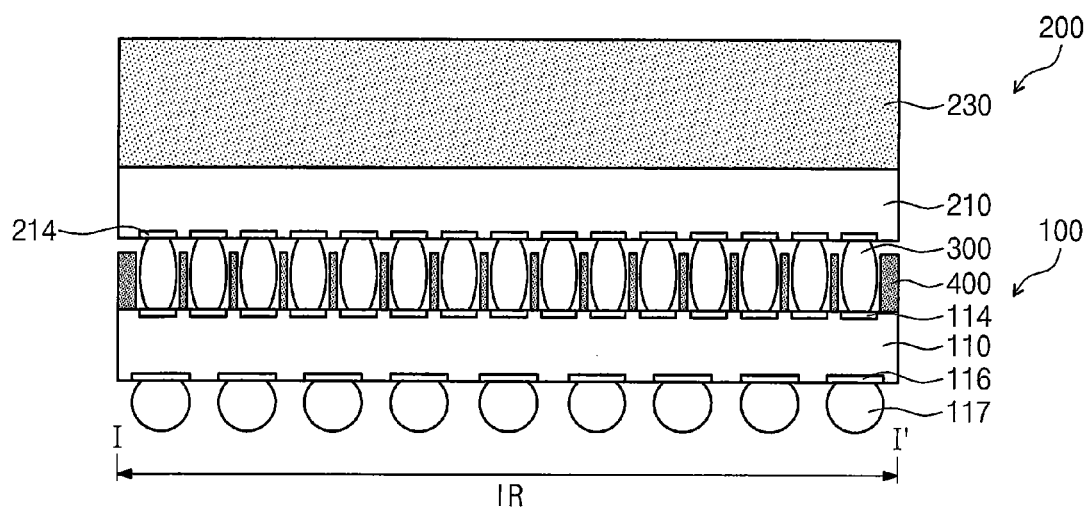
FIGS. 2 through 5 are cross-sectional views taken along lines and IV-IV' of FIG. 1, respectively.
Figure 3:
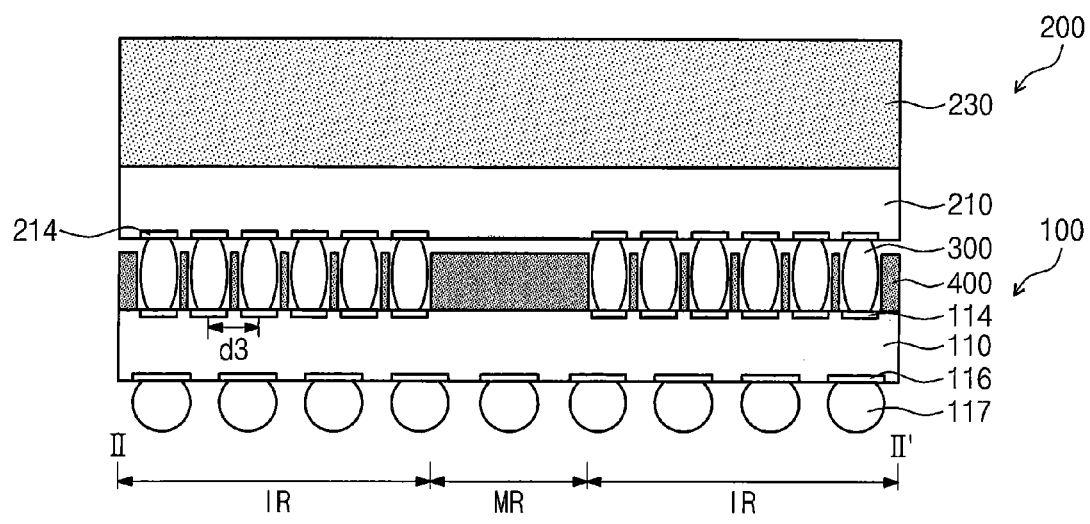
Figure 4:
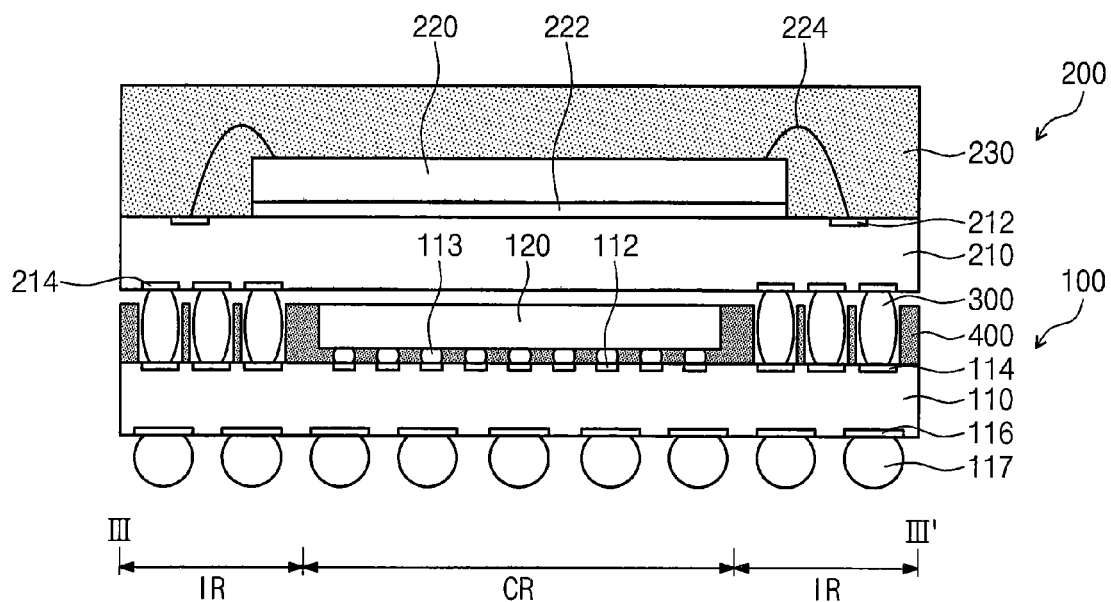
Figure 5:
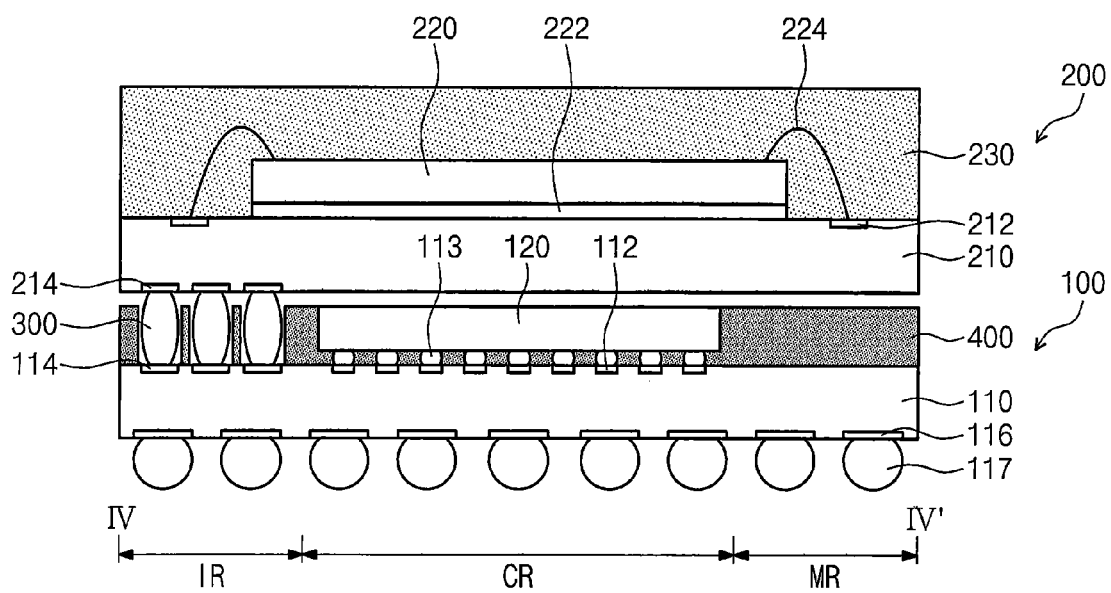

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," (and variants thereof) when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, example embodiments of the inventive concepts will be described in detail with reference to the accompanying drawings.

FIG. 1 is a plan view of a semiconductor package according to a first embodiment of the inventive concepts. FIGS. 2 through 5 are cross-sectional views taken along lines I-I', II-II', and IV-IV' of FIG. 1, respectively. Hereinafter, description is provided about a semiconductor package according to the first embodiment of the inventive concepts with reference to FIGS. 1 through 5.

Referring to FIGS. 1 through 5, a semiconductor package 10 may include a lower (first) package 100, an upper (second) package 200, interconnection terminals 300, and a lower (first) molding film 400.

The lower package 100 may include a lower (first) package substrate 110 and a lower (first) semiconductor chip 120 mounted on the lower package substrate 110.

The lower package substrate 110 may include a chip region CR in the center, an interconnection region IR outside of and enclosing a portion of the chip region CR, and a mold injection region MR defined by the chip region CR and the interconnection region IR. The width d1 of the mold injection region MR in one direction (e.g., x-axis direction) may be smaller than the width d2 of the lower semiconductor chip 120 in the one direction (e.g., x-axis direction). Furthermore, the width d1 of the mold injection region MR in one direction (e.g., x-axis direction) may be greater than ⅕ of the width d5 of the lower package substrate 110 in the one direction (e.g., x-axis direction). The lower package substrate 110 may include lower (first) chip pads 112, lower (first) interconnection pads 114, and external interconnection pads 116. The lower chip pads 112 may be disposed on the top surface of the lower package substrate 110 of the chip region CR and have lower (first) chip bumps 113 provided thereon. The lower interconnection pads 114 may be disposed on the top surface of the lower package substrate 110 of the interconnection region IR but may not be disposed on the top surface of the lower package substrate 110 of the mold injection region MR. Accordingly, the lower interconnection pads 114 may be arrayed discontinuously by the mold injection region MR. Furthermore, the interval d3 between the lower interconnection pads 114 in one direction (e.g., x-axis direction) may be smaller than the width d1 of the mold injection region MR in the one direction (e.g., x-axis direction), and, in detail, the interval d3 between the lower interconnection pads 114 in one direction (e.g., x-axis direction) may be smaller than a half of the width d1 of the mold injection region MR in the one direction (e.g., x-axis). The external interconnection pads 116 may be disposed on a bottom surface of the lower package substrate 110, and external interconnection bumps 117 may be provided on the external interconnection pads 116. For example, the lower package substrate 110 may be a printed circuit board or a flexible printed circuit board.

The lower semiconductor chip 120 may be mounted on the lower package substrate 110 of the chip region CR and electrically connected to the lower chip pads 112 through the lower chip bumps 113. For example, the lower semiconductor chip 120 may be a system on a chip (SOC). The lower semiconductor chip 120 may have a first edge E1 and a second edge E2 facing each other, and have a third edge E3 and a fourth edge E4 perpendicular to the first and second edges E1 and E2 and facing each other. In addition, the mold injection region MR may be disposed adjacent to any one of the first to fourth edges E1, E2, E3 and E4 of the lower semiconductor chip 120.

The upper (second) package 200 may include an upper (second) package substrate 210, an upper (second) semiconductor chip 220, and an upper (second) molding film 230.

The upper package substrate 210 may be stacked on the lower package 100 and include upper (second) chip pads 212 and upper (second) interconnection pads 214. The upper chip pads 212 may be disposed on a top surface of the upper package substrate 210. The upper interconnection pads 214 may be disposed on the bottom surface of the upper package substrate 210 in order to correspond to the lower interconnection pads 114. For example, the upper interconnection substrate 210 may be a printed circuit board or a flexible printed circuit board.

The upper semiconductor chip 220 may be mounted on the upper package substrate 210 and electrically connected to the upper chip pads 212 through bonding wires 224 and/or other techniques. An insulating adhesive film 222 may be interposed between the upper semiconductor chip 220 and the upper package substrate 210. The upper semiconductor chip 220 may include a plurality of semiconductor chips, for example, a memory device such as DRAM, NAND flash, NOR flash, OneNAND, PRAM, ReRAM, and/or MRAM.

The upper molding film 230 may be formed to cover the top surface of the upper package substrate 210, the upper semiconductor chip 220 and bonding wires 224. For example, the upper molding film 230 may include an epoxy molding compound.

The interconnection terminals 300 may be disposed between the lower interconnection pads 114 and the upper interconnection pads 214 and electrically interconnect the lower interconnection pads 114 with the upper interconnection pads 214. Since disposed on the lower interconnection pads 114, the interconnection terminals 300 may be disposed on the lower package substrate 110 of the interconnection region IR but may not be disposed on the lower package substrate 110 of the mold injection region MR. Accordingly, the interconnection terminals 300 may be discontinuously arrayed by the mold injection region MR. Furthermore, the interval d4 between the interconnection terminals 300 in one direction (e.g., x-axis direction) may be smaller than the width d1 of the mold injection region in the one direction (e.g., x-axis direction). More desirably, the interval d4 between the interconnection terminals 300 in one direction (e.g., x-axis direction) may be smaller than a half of the width d1 of the mold injection region MR in the one direction (e.g., x-axis direction). The interval d3 between the lower interconnection pads 300 in one direction (e.g., x-axis direction) may be the same as the interval d4 between the interconnection terminals 300 in the one direction (e.g., the x-axis).

The lower molding film 400 may mold the lower semiconductor chip 120 between the lower package substrate 110 and the upper package substrate 210. In other words, the lower molding film 400 may cover at least a portion of side surfaces of the lower semiconductor chip 120 and fill between the lower chip bumps 113. The level of the top surface of the lower molding film 400 may be the same as the level of the top surface of the lower semiconductor chip 120 or lower than the level of the top surface of the lower semiconductor chip 120. Accordingly, the top surface of the lower semiconductor chip 120 may be exposed. The lower molding film 400 may also fill between the interconnection terminals 300. For example, the lower molding film 400 may include an epoxy molding compound.

Accordingly, FIGS. 1-5 illustrate various embodiments of the inventive concepts that provide an array of interconnection terminals 300 that extend outside and around the first semiconductor chip 120, from the first package substrate 110 to the second package substrate 210. The array of interconnection terminals 300 include a gap G therein, that is configured to provide a passageway from mold solution to flow from outside the first semiconductor chip 120 to between the first semiconductor chip 120 and the first package substrate. The gap G may be configured to provide a passageway by configuring the length, width, shape and/or location of the gap G and/or the number of gaps G that is provided for a given semiconductor package, depending on the molding process that is employed and the other parameters of the semiconductor package, such as the dimensions of the first semiconductor chip and the first package substrate, and/or the location and/or dimensions of the interconnection terminals.

Figure 6:
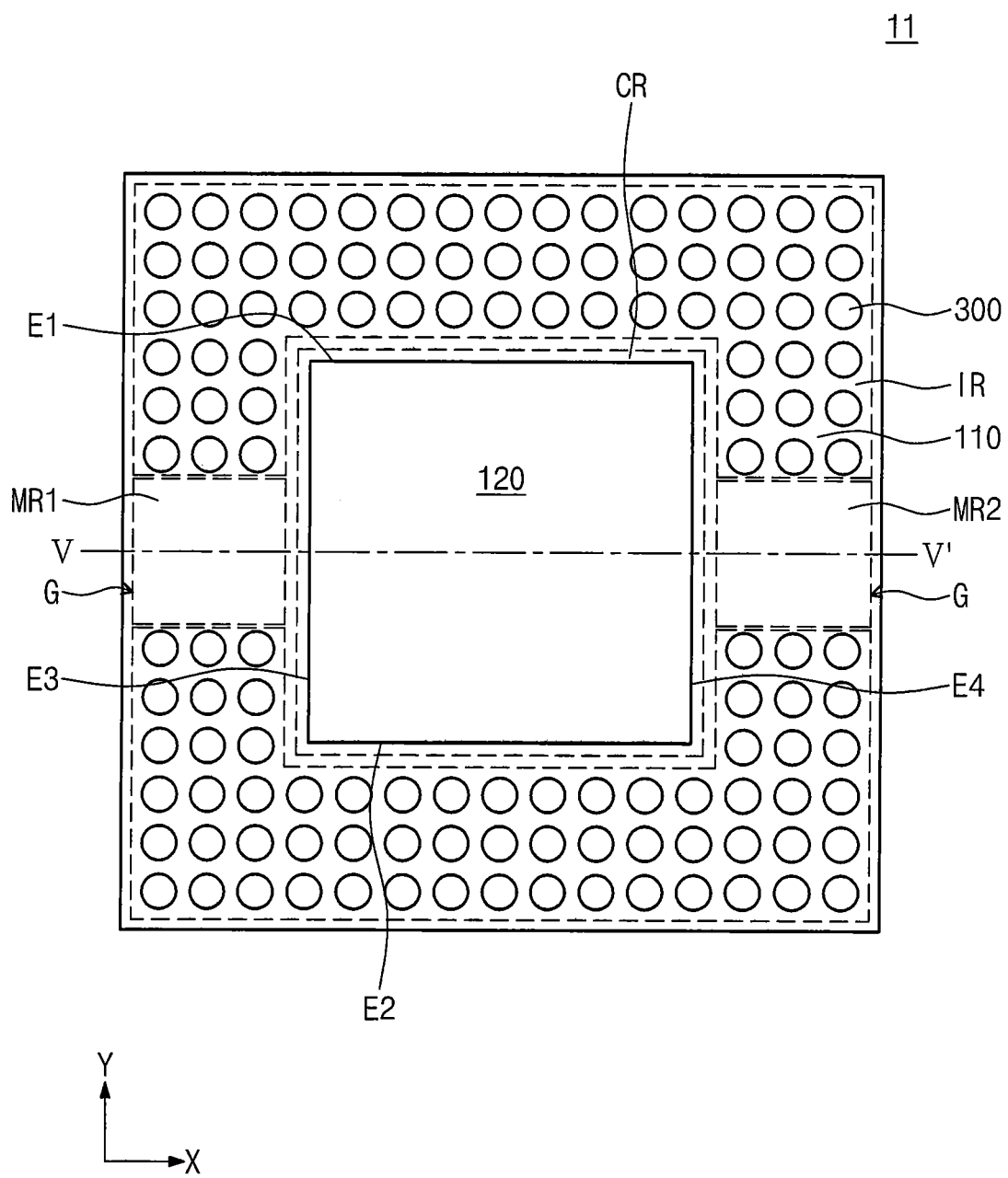
Figure 7:
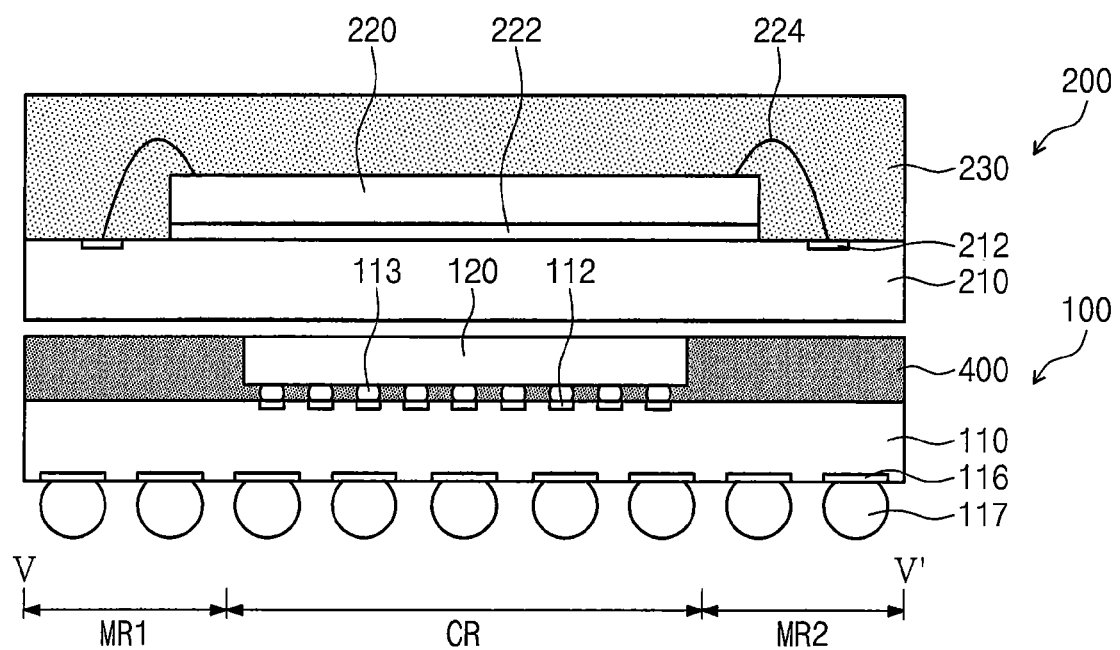
FIG. 7 is a cross-sectional view taken along a line V-V' of FIG. 6.

FIG. 6 is a plan view of a semiconductor package according to a second embodiment of the inventive concepts. FIG. 7 is a cross-sectional view taken along a line V-V' of FIG. 6. Hereinafter, description is provided about a semiconductor package according to the second embodiment of the inventive concepts with reference to FIGS. 6 and 7. For conciseness of explanation, description about the substantially same elements as those of the first embodiment described above is omitted, and description is provided about the mold injection regions MR1 and MR2 and the interconnection terminals 300.

Referring to FIGS. 6 and 7, the lower package substrate 110 may include a first mold injection region MR1 and a second mold injection region MR2 separated from each other. The first and second mold injection regions MR1 and MR2 may face each other with the chip region CR in-between. The first mold injection region MR1 may be disposed adjacent to the center of the third edge E3 of the lower semiconductor chip 120 and the second mold injection region MR2 may be disposed adjacent to the center of the fourth edge E4 of the lower semiconductor chip 120.

The interconnection terminals 300 may electrically connect the lower interconnection pads (see reference numeral 114 of FIGS. 2 to 5) to the upper interconnection pads (see reference numeral 214 of FIGS. 2 to 5). The interconnection terminals 300 are disposed on the lower package substrate 110 of the interconnection region IR but may not be disposed on the lower package substrate 110 of the first and second mold injection regions MR1 and MR2. Accordingly, the interconnection terminals 300 may be discontinuously arrayed by the first and second mold injection regions MR1 and MR2. In other words, the interconnection terminals 300 may be discontinuously arrayed around the center of the third edge E3 by the first mold injection region MR1 and discontinuously arrayed around the center of the fourth edge E4 by the second mold injection region MR2.

Figure 8:
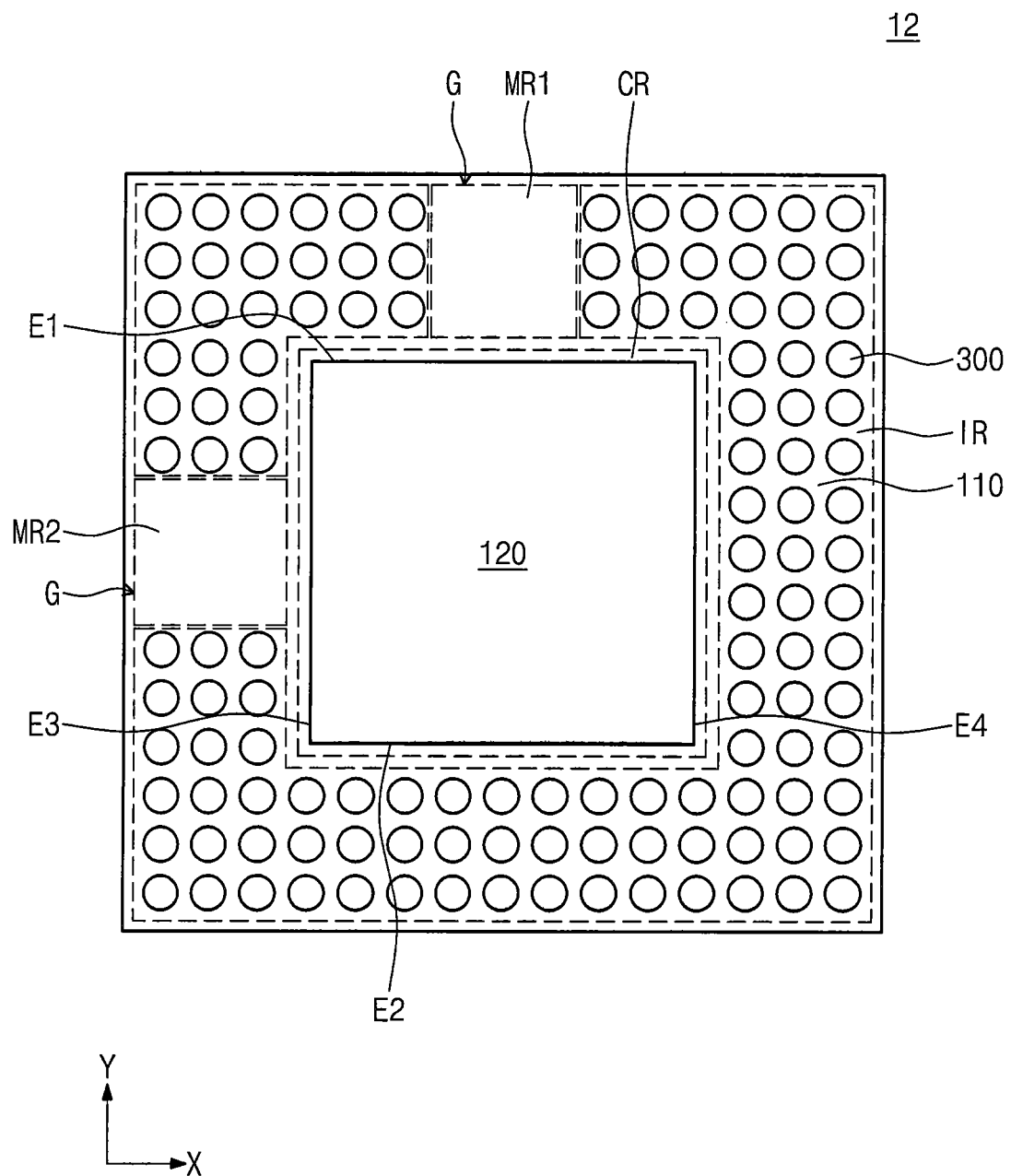

FIG. 8 is a plan view of a semiconductor package according to a third embodiment of the inventive concepts. Hereinafter, description is provided about a semiconductor package according to the third embodiment of the inventive concepts with reference to FIG. 8. For conciseness of explanation, description about the substantially same elements as those of the first embodiment described above is omitted, and description is provided about the mold injection regions MR1 and MR2 and the interconnection terminals 300.

Referring to FIG. 8, the lower package substrate 110 may include a first mold injection region MR1 and a second mold injection region MR2 separated from each other. The first mold injection region MR1 may be disposed adjacent to the first edge E1 of the lower semiconductor chip 120 and the second mold injection region MR2 may be disposed adjacent to the third edge E3 of the lower semiconductor chip 120. Furthermore, the first mold injection region MR1 may be disposed adjacent to the center of the first edge E1 and the second mold injection region MR2 may be disposed adjacent to the center of the third edge E3.

The interconnection terminals 300 may electrically connect the lower interconnection pads (see reference numeral 114 of FIGS. 2 to 5) to the upper interconnection pads (see reference numeral 214 of FIGS. 2 to 5). The interconnection terminals 300 may be disposed on the lower package substrate 110 of the interconnection region IR but may not be disposed on the lower package substrate 110 of the first and second mold injection regions MR1 and MR2. Accordingly, the interconnection terminals 300 may be discontinuously arrayed by the first and second mold injection regions MR1 and MR2. In other words, the interconnection terminals 300 may be discontinuously arrayed around the center of the first edge E1 by the first mold injection region MR1 and discontinuously arrayed around the center of the third edge E3 by the second mold injection region MR2.

Figure 9:
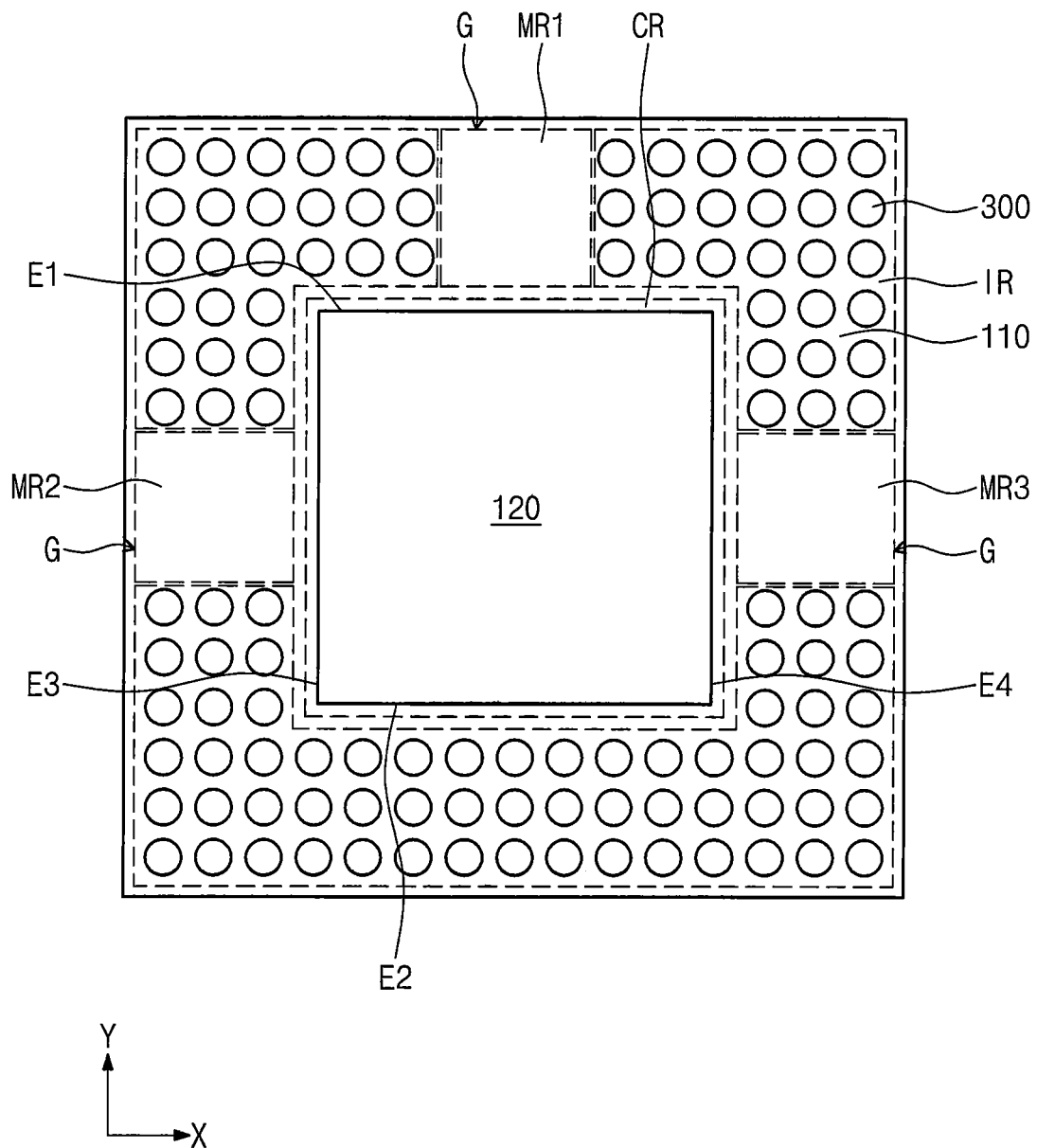

FIG. 9 is a plan view of a semiconductor package according to a fourth embodiment of the inventive concepts. Hereinafter, description is provided about a semiconductor package according to the fourth embodiment of the inventive concepts with reference to FIG. 9. For conciseness of explanation, description about the substantially same elements as those of the first embodiment described above is omitted, and description is provided about the mold injection regions MR1, MR2 and MR3, and the interconnection terminals 300.

Referring to FIG. 9, the lower package substrate 110 may include a first mold injection region MR1, a second mold injection region MR2 and a third mold injection region MR3 separated from each other. The first mold injection region MR1 may be disposed adjacent to the first edge E1 of the lower semiconductor chip 120, the second mold injection region MR2 may be disposed adjacent to the third edge E3 of the lower semiconductor chip 120, and the third mold injection region MR3 may be disposed adjacent to the fourth edge E4 of the lower semiconductor chip 120. Furthermore, the first mold injection region MR1 may be disposed adjacent to the center of the first edge E1, the second mold injection region MR2 may be disposed adjacent to the center of the third edge E3, and the third mold injection region MR3 may be disposed adjacent to the center of the fourth edge E4.

The interconnection terminals 300 may electrically connect the lower interconnection pads (see reference numeral 114 of FIGS. 2 to 5) to the upper interconnection pads (see reference numeral 214 of FIGS. 2 to 5). The interconnection terminals 300 are disposed on the lower package substrate 110 of the interconnection region IR but may not be disposed on the lower package substrate 110 of the first, second and third mold injection regions MR1, MR2, and MR3. Accordingly, the interconnection terminals 300 may be discontinuously arrayed by the first, second, and third mold injection regions MR1, MR2, and MR3. In other words, the interconnection terminals 300 may be discontinuously arrayed around the center of the first edge E1 by the first mold injection region MR1, discontinuously arrayed around the center of the third edge E3 by the second mold injection region MR2, and discontinuously arrayed around the center of the fourth edge E4 by the third mold injection region MR3.

Accordingly, FIGS. 1, 8 and 9 also illustrate various embodiments of the inventive concepts, wherein the first semiconductor chip 120 comprises a plurality of edges, and wherein at least one of the edges is devoid of a gap G adjacent thereto.

Figure 10:
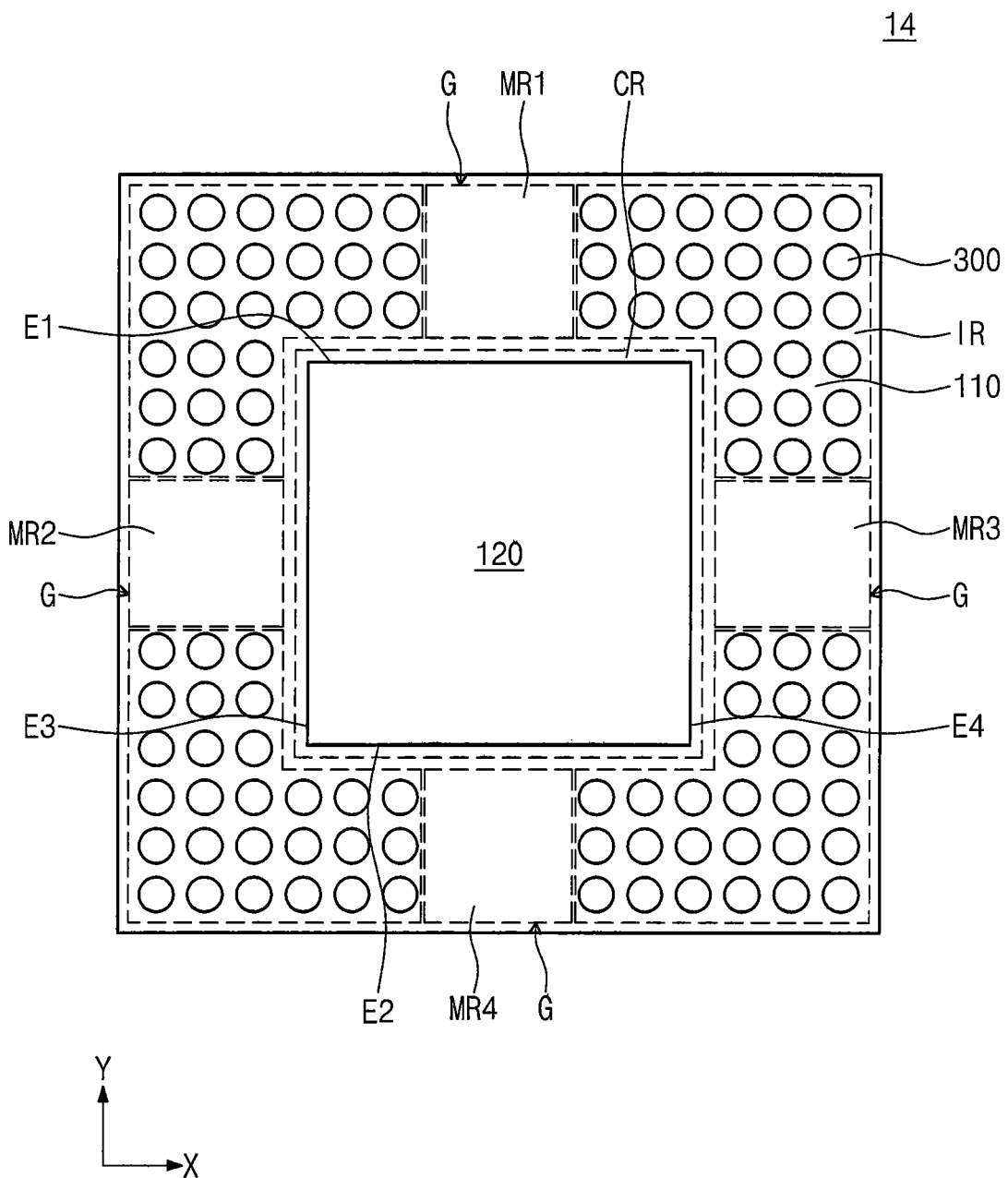

FIG. 10 is a plan view of a semiconductor package according to a fifth embodiment of the inventive concepts. Hereinafter, description is provided about a semiconductor package according to the fifth embodiment of the inventive concepts with reference to FIG. 10. For conciseness of explanation, description about the substantially same elements as those of the first embodiment described above is omitted, and description is provided about the mold injection regions MR1, MR2, MR3, and MR4, and the interconnection terminals 300.

Referring to FIG. 10, the lower package substrate 110 may include a first mold injection region MR1, a second mold injection region MR2, a third mold injection region MR3 and a fourth mold injection region MR4 separated from each other. The first mold injection region MR1 may be disposed adjacent to the first edge E1 of the lower semiconductor chip 120, the second mold injection region MR2 may be disposed adjacent to the third edge E3 of the lower semiconductor chip 120, the third mold injection region MR3 may be disposed adjacent to the fourth edge E4 of the lower semiconductor chip 120, and the fourth mold injection region MR4 may be disposed adjacent to the second edge E2 of the lower semiconductor chip 120. Furthermore, the first mold injection region MR1 may be disposed adjacent to the center of the first edge E1, the second mold injection region MR2 may be disposed adjacent to the center of the third edge E3, the third mold injection region MR3 may be disposed adjacent to the center of the fourth edge E4, and the fourth mold injection region MR4 may be disposed adjacent to the center of the second edge E2.

The interconnection terminals 300 may electrically connect the lower interconnection pads (see reference numeral 114 of FIGS. 2 to 5) to the upper interconnection pads (see reference numeral 214 of FIGS. 2 to 5). The interconnection terminals 300 may be disposed on the lower package substrate 110 of the interconnection region IR but may not be disposed on the lower package substrate 110 of the first, second, third, and fourth mold injection regions MR1, MR2, MR3, and MR4. Accordingly, the interconnection terminals 300 may be discontinuously arrayed by the first, second, third, and fourth mold injection regions MR1, MR2, MR3, and MR4. In other words, the interconnection terminals 300 may be discontinuously arrayed around the center of the first edge E1 by the first mold injection region MR1, discontinuously arrayed around the center of the third edge E3 by the second mold injection region MR2, discontinuously arrayed around the center of the fourth edge E4 by the third mold injection region MR3, and discontinuously arrayed around the center of the second edge E2 by the fourth mold injection region MR4.

Figure 11:
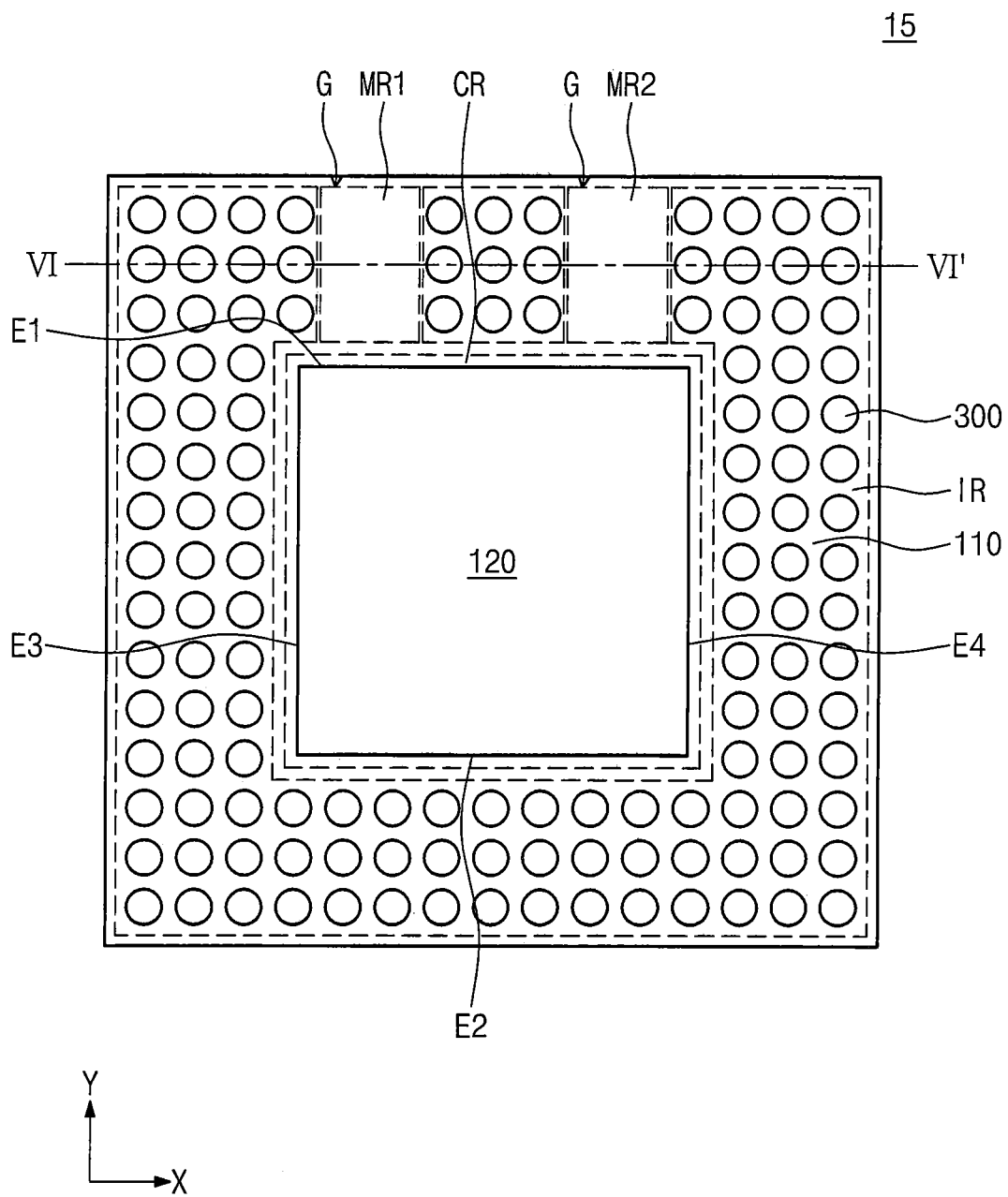
Figure 12:
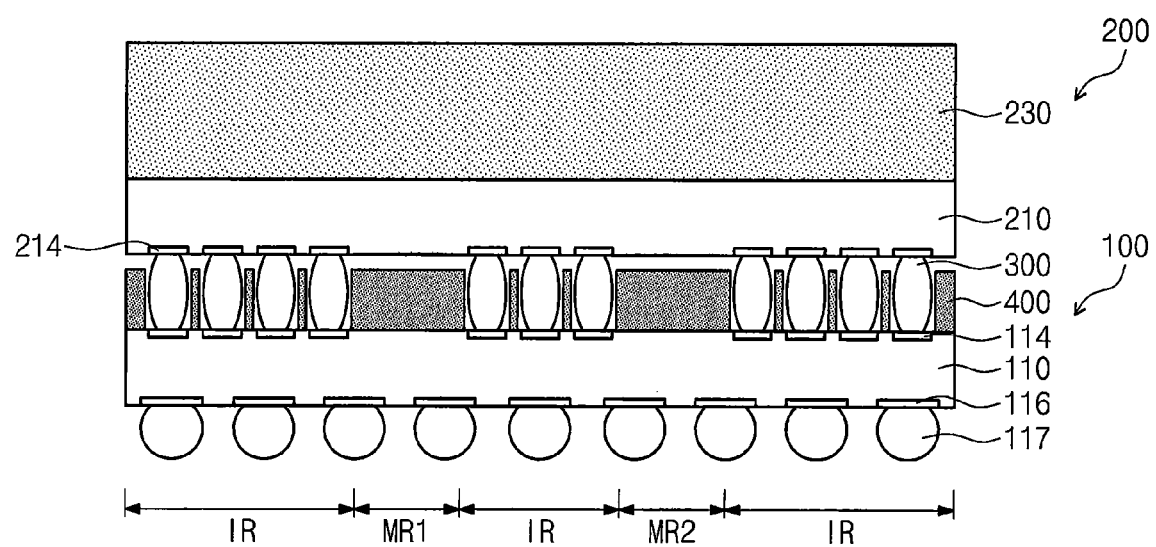
FIG. 12 is a cross-sectional view taken along a line VI-VI' of FIG. 11.

FIG. 11 is a plan view of a semiconductor package according to a sixth embodiment of the inventive concepts. FIG. 12 is a cross-sectional view taken along a line VI-VI' of FIG. 11. Hereinafter, description is provided about a semiconductor package according to the sixth embodiment of the inventive concepts with reference to FIGS. 11 and 12. For conciseness of explanation, description about the substantially same elements as those of the first embodiment described above is omitted, and description is provided about the mold injection regions MR1 and MR2 and the interconnection terminals 300.

Referring to FIGS. 11 and 12, the lower package substrate 110 may include a first mold injection region MR1 and a second mold injection region MR2 separated from each other. The first and second mold injection regions MR1 and MR2 may be disposed adjacent to any one of the first to fourth edges E1, E2, E3 and E4. As an example, the first and second mold injection regions MR1 and MR2 may be disposed adjacent to the first edge E1.

The interconnection terminals 300 may electrically connect the lower interconnection pads 114 to the upper interconnection pads 214. The interconnection terminals 300 may be disposed on the lower package substrate 110 of the interconnection region IR but may not be disposed on the lower package substrate 110 of the first and second mold injection regions MR1 and MR2. Accordingly, the interconnection terminals 300 may be discontinuously arrayed by the first and second mold injection regions MR1 and MR2. As an example, the interconnection terminals 300 may be discontinuously arrayed around the first edge by the first and second mold injection regions MR1, and MR2.

FIG. 13A through FIG. 17A represent manufacturing methods of a semiconductor package according to embodiments of the inventive concepts and are cross-sectional views taken along a line I-I' of FIG. 1. FIG. 13B through FIG. 17B represent manufacturing methods of a semiconductor package according to embodiments of the inventive concepts and are cross-sectional views taken along a line IV-IV' of FIG. 1. Hereinafter, description is provided about the methods of manufacturing a semiconductor package according to embodiments of the inventive concepts with reference to FIGS. 1, 13A through 17A, and 13B through 17B. Duplicated description with the above for the disposition and materials of the elements may be omitted.

Figure 13A:
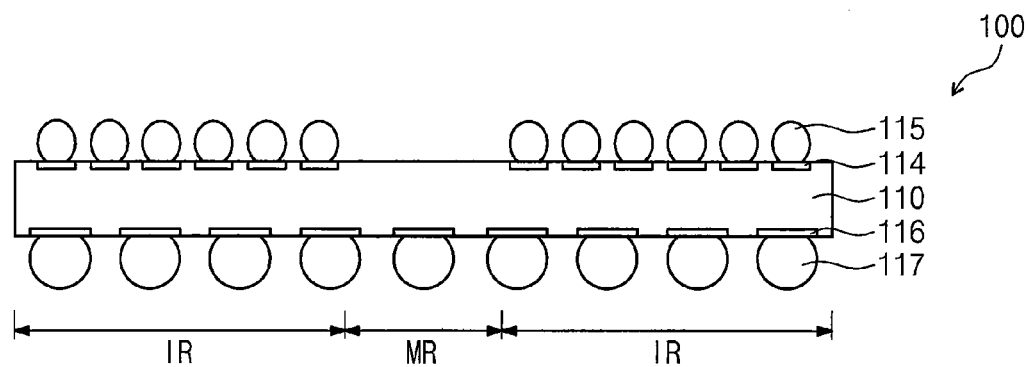
Figure 13B:
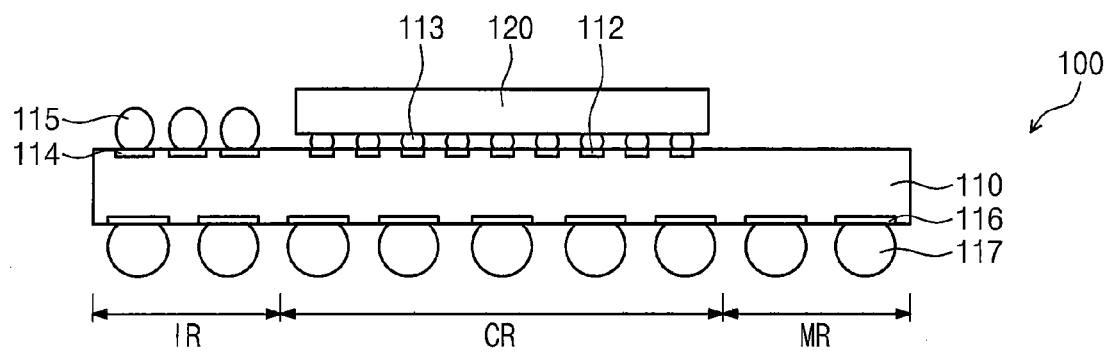

Referring to FIGS. 1, 13A and 13B, a lower package 100 may be provided which includes a lower package substrate 110 and a lower semiconductor chip 120 mounted on the lower package substrate 110.

The lower package substrate 110 may include a chip region CR in the center, an interconnection region IR enclosing a portion of the chip region CR, and a mold injection region MR defined by the chip region CR and the interconnection region IR. The mold injection region MR may include a first mold injection region MR1, a second mold injection region MR2, a third mold injection region MR3, and/or a fourth mold injection region MR4 separated from each other as described in relation to FIGS. 6, and 8 through 11. The lower package substrate 110 may include lower chip pads 112, lower interconnection pads 114, and external interconnection pads 116. The lower chip pads 112 may be disposed on a top surface of the lower package substrate 110 of the chip region CR and have lower chip bumps 113 provided thereon. The lower interconnection pads 114 may be disposed on the top surface of the lower package substrate 110 of the interconnection region IR but may not be disposed on the top surface of the lower package substrate 110 of the mold injection region MR. Accordingly, the lower interconnection pads 114 may be arrayed discontinuously by the mold injection region MR. Lower solder balls 115 may be provided on the lower interconnection pads 114. Since the lower solder balls 115 are disposed on the lower interconnection pads 114, the lower solder balls 115 may be disposed on the lower package substrate 110 of the interconnection region IR but may not be disposed on the lower package substrate 110 of the mold injection region MR. Accordingly, the lower solder balls 115 may be discontinuously arrayed by the mold injection region MR. The external interconnection pads 116 may be disposed on a bottom surface of the lower package substrate 110 and the external interconnection bumps 117 may be disposed under the external interconnection pads 116. For example, the lower package substrate 110 may be a printed circuit board or a flexible printed circuit board.

The lower semiconductor chip 120 may be mounted on the lower package substrate 110 of the chip region CR and electrically connected to the lower chip pads 112 through the lower chip bumps 113. For example, the lower semiconductor chip 120 may be a system on a chip (SOC). The lower semiconductor chip 120 may have a first edge E1 and a second edge E2 facing each other, and have a third edge E3 and a fourth edge E4 perpendicular to the first and second edges E1 and E2 and facing each other.

The mold injection region MR may be disposed adjacent to any one of the first to fourth edges E1, E2, E3 and E4 of the lower semiconductor chip 120.

As an example, when the mold injection region MR includes the first and second mold injection regions MR1 and MR2 as described in relation to FIG. 6, the first and second mold injection regions MR1 and MR2 may face each other with the chip region CR therebetween. The first mold injection region MR1 may be disposed adjacent to the center of the third edge E3 of the lower semiconductor chip 120 and the second mold injection region MR2 may be disposed adjacent to the center of the fourth edge E4 of the lower semiconductor chip 120.

As another example, when the mold injection region MR includes the first and second mold injection regions MR1 and MR2 as described in relation to FIG. 8, the first mold injection region MR1 may be disposed adjacent to the first edge E1 of the lower semiconductor chip 120 and the second mold injection region MR2 may be disposed adjacent to the third edge E3 of the lower semiconductor chip 120. Furthermore, the first mold injection region MR1 may be disposed adjacent to the center of the first edge E1 and the second mold injection region MR2 may be disposed adjacent to the center of the third edge E3.

As another example, when the mold injection region MR includes the first, second, and third mold injection regions MR1, MR2, and MR3 as described in relation to FIG. 9, the first mold injection region M1 may be disposed adjacent to the first edge E1 of the lower semiconductor chip 120, the second mold injection region MR2 may be disposed adjacent to the third edge E3 of the lower semiconductor chip 120, and the third mold injection region MR3 may be disposed adjacent to the fourth edge E4 of the lower semiconductor chip 120. Furthermore, the first mold injection region MR1 may be disposed adjacent to the center of the first edge E1, the second mold injection region MR2 may be disposed adjacent to the center of the third edge E3, and the third mold injection region MR3 may be disposed adjacent to the center of the fourth edge E4.

As another example, when the mold injection region MR includes the first, second, third, and fourth mold injection regions MR1, MR2, MR3, and MR4 as described in relation to FIG. 10, the first mold injection region M1 may be disposed adjacent to the first edge E1 of the lower semiconductor chip 120, the second mold injection region MR2 may be disposed adjacent to the third edge E3 of the lower semiconductor chip 120, the third mold injection region MR3 may be disposed adjacent to the fourth edge E4 of the lower semiconductor chip 120, and the fourth mold injection region MR4 may be disposed adjacent to the second edge E2 of the lower semiconductor chip 120. Furthermore, the first mold injection region MR1 may be disposed adjacent to the center of the first edge E1, the second mold injection region MR2 may be disposed adjacent to the center of the third edge E3, the third mold injection region MR3 may be disposed adjacent to the center of the fourth edge E4, and the fourth mold injection region MR4 may be disposed adjacent to the center of the second edge E2.

As another example, when the mold injection region MR includes the first and second mold injection regions MR1 and MR2 as described in relation to FIG. 11, the first and second mold injection regions MR1 and MR2 may be disposed adjacent to any one of the first to fourth edges E1, E2, E3, and E4. For example, the first and second mold injection regions MR1 and MR2 may be disposed adjacent to the first edge E1.

Referring to FIGS. 1, 14A, 14B, 15A and 15B, a lower molding film 400 molding the lower semiconductor chip 120 may be formed on the lower package substrate 110. The forming the lower molding film 400 may include applying a mold solution 410 on the lower package substrate 110 to cover the lower chip bumps 113 and the lower solder balls 115 and laser-drilling the applied mold solution 410 to expose the lower solder balls 115.

Figure 14A:
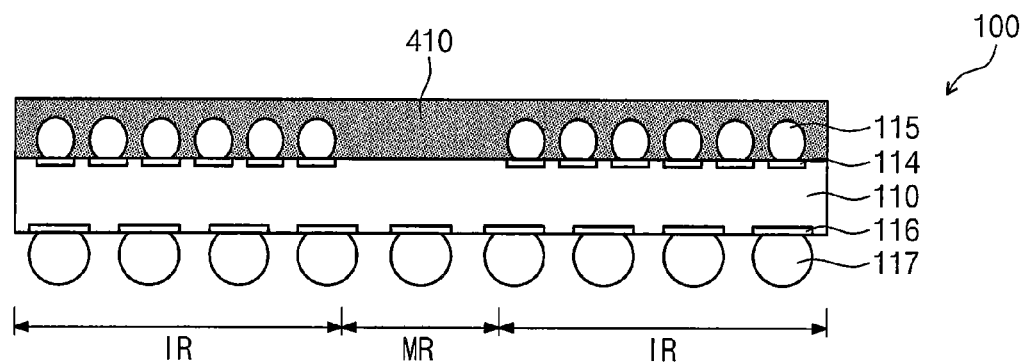
Figure 14B:
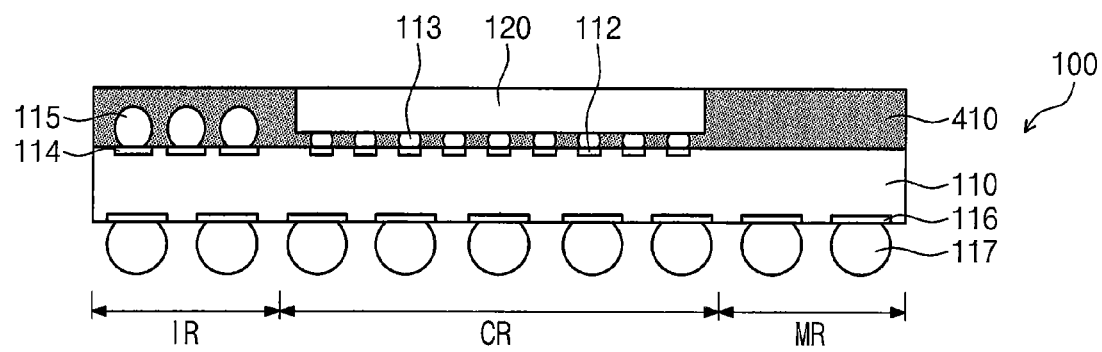

In detail, referring to FIGS. 1, 14A and 14B, the mold solution 410 may be applied on the lower package substrate 110. The mold solution 410 may be applied by allowing the mold solution 410 to flow in any one direction on the lower package substrate 110. As an example, the mold solution 410 may be applied by allowing it to flow in a direction towards the second edge E2 from the first edge E1 (a negative direction of y-axis). The mold solution 410 may be injected into the chip region CR through the mold injection region MR and fill a space between the lower chip bumps 113 between the lower package substrate 110 and the lower semiconductor chip 120 of the chip region CR. The applied mold solution 410 may cover the lower chip bumps 113 and the lower solder balls 115. The level of the top surface of the applied mold solution 410 may be the same as or lower than the level of the top surface of the lower semiconductor chip 120. Accordingly, the top surface of the lower semiconductor chip 120 may be exposed.

Figure 18:
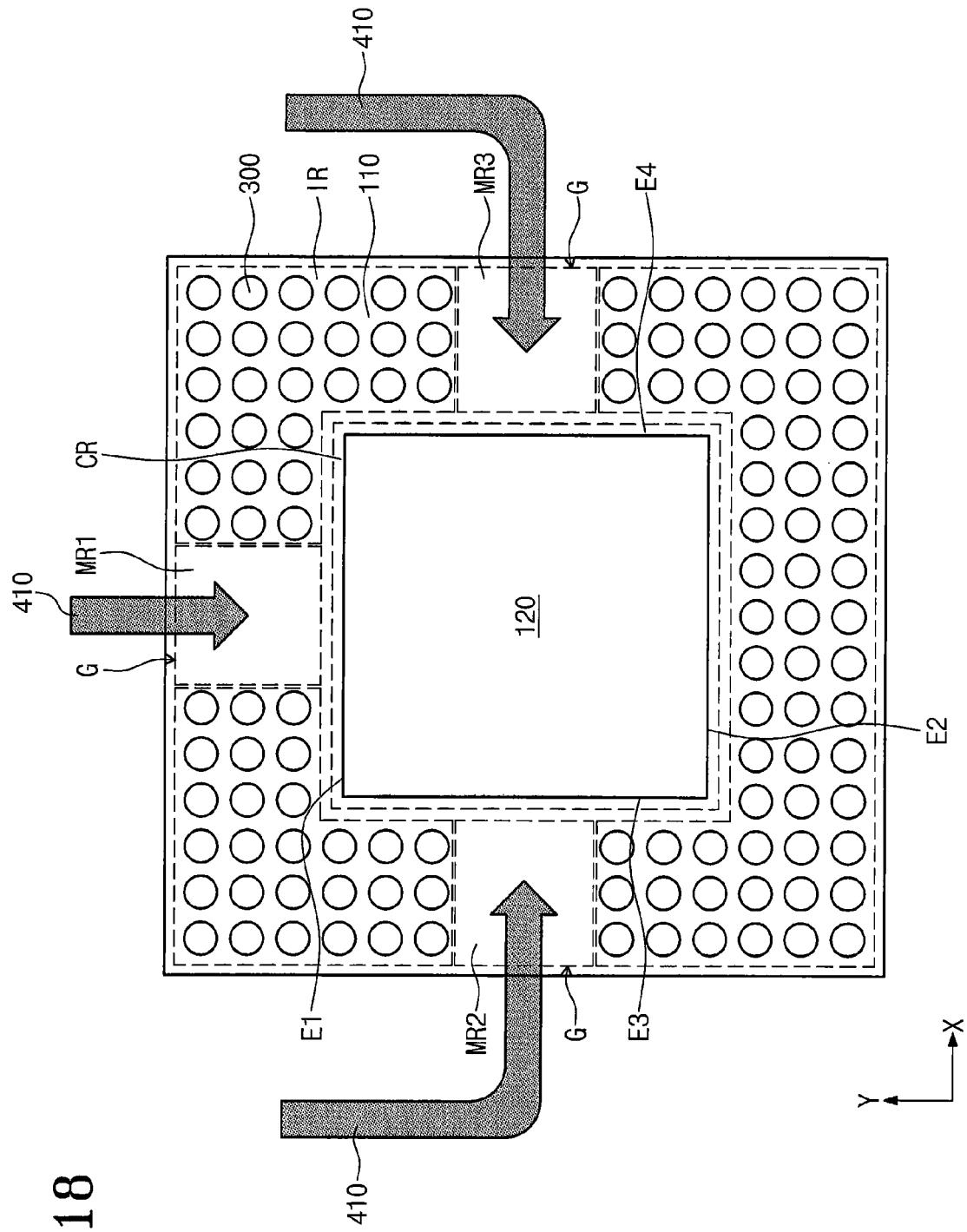
FIG. 18 is a plan view representing a flow of a mold solution during applying the mold solution in a manufacturing process of a semiconductor package according to a fourth embodiment of the inventive concepts.

FIG. 18 is a plan view representing a flow of the mold solution 410 during applying the mold solution 410 in a manufacturing process of a semiconductor package according to the fourth embodiment of the inventive concepts. Referring to FIG. 18, the mold solution 410 may be applied on the lower package substrate 110 by flowing in a direction towards the second edges E2 from the first edge E1. The mold solution 410 may cover the lower chip bumps 113 and the lower solder balls 115. A portion of the mold solution 410 may be injected into the chip region CR through the first, second, and third mold injection regions MR1, MR2, and MR3 and fill the space between the lower chip bumps 113 between the lower package substrate 110 and the lower semiconductor chip 120 of the chip region CR. In this case, a flow of the mold solution 410 being injected into the chip region CR through the first, second, and third mold injection regions MR1, MR2, and MR3, and a flow of the mold solution 410 flowing the outside of the lower package substrate 110 on which the lower solder balls 115 are not disposed are similar in speed, and a void occurrence rate in the chip region CR is reduced. A portion of the mold solution 410 injected to the chip region CR may be discharged between the lower solder balls 115 that are adjacent to the second edge E2.

Accordingly, FIG. 18 illustrates various embodiments of the inventive concepts wherein the gap G in the array of interconnection terminals 300 is configured to substantially prevent mold solution 410 that flows from outside the first semiconductor chip 120 to between the first semiconductor chip 120 and the lower package substrate 110 in a first direction (corresponding to the −Y direction of FIG. 8), from also substantially flowing from outside the first semiconductor chip 120 to between the first semiconductor chip 120 and the lower package substrate 110 in a second direction that is opposite the first direction (corresponding to the +Y direction of FIG. 8). It will be understood that, in these embodiments, flow from the −Y direction through the second edge E2 may only be substantially prevented. There may be some minimal flow of mold solution 410 beneath the edge E2 in the +Y direction, but not enough flow so as to create a void between the first chip 120 and the first substrate 110.

FIG. 18 also illustrates embodiments wherein the gap G is further configured to substantially prevent mold solution 410 that flows from outside the first semiconductor chip 120 to between the first semiconductor chip 120 and the first package substrate 110 in a first direction, such as the −Y direction of FIG. 18, and perpendicular to the first direction, such as the +X and −X directions of FIG. 18, from also substantially flowing from outside the first semiconductor chip 120 to between the first semiconductor chip and the lower package substrate 110 in a second direction that is opposite the first direction, such as the +Y direction of FIG. 18. Stated differently, substantial inflows of the mold solution 410 between the first semiconductor chip 120 and the first package substrate 110 take place through the gaps G and into the first, third and fourth edge E1, E3, E4 of the first semiconductor chip 120, but substantially no inflow takes place through the second edge E2. In fact, there may be some outflow through edge E2. Accordingly, the gaps G in the array of interconnection terminals 300 are configured to prevent formation of a void in the mold solution 410 that flows from outside the first semiconductor chip 120 to between the first semiconductor chip 120 and the first package substrate 110.

Figure 19:
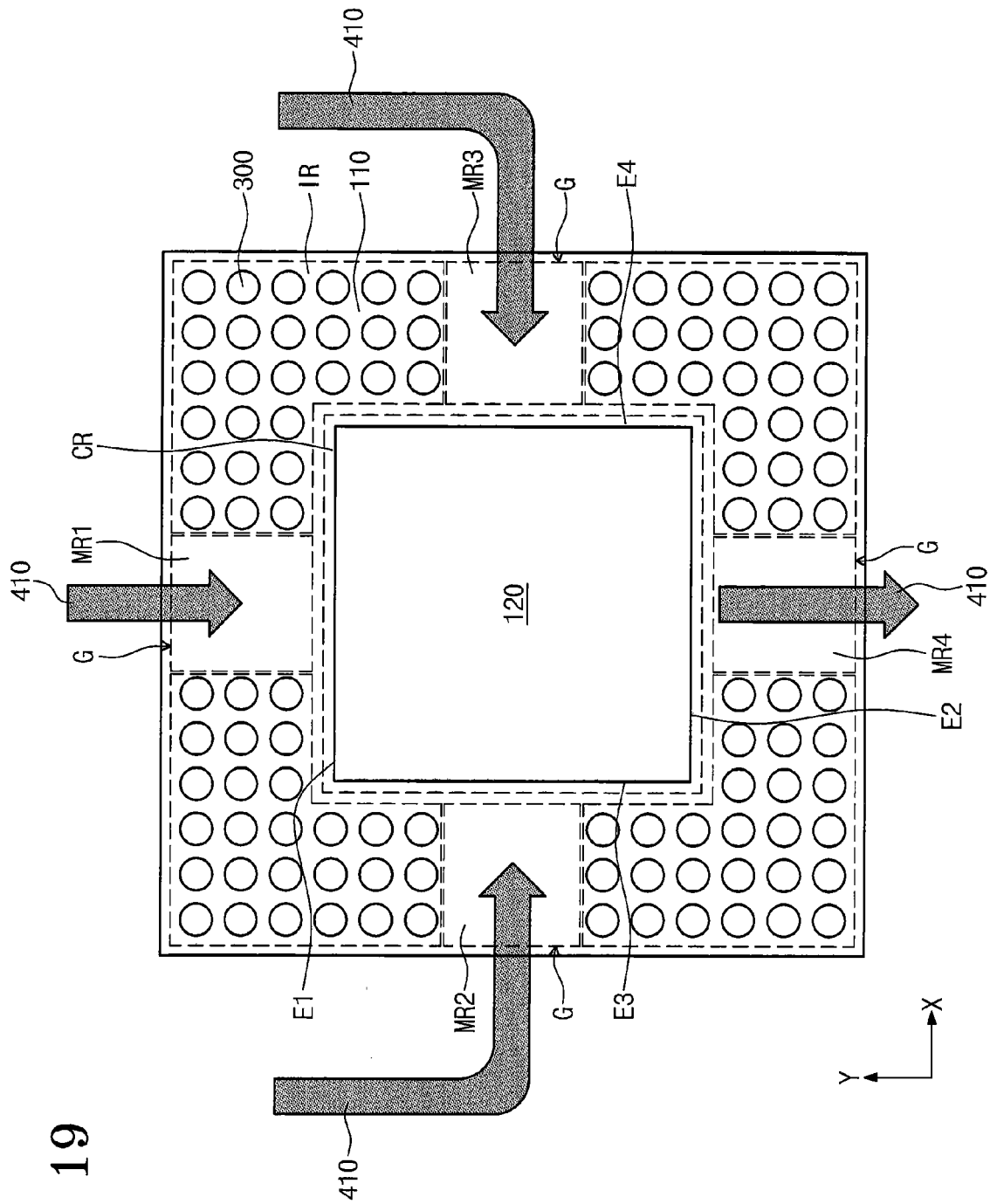
FIG. 19 is a plan view representing a flow of mold solution during applying the mold solution in a manufacturing process of a semiconductor package according to a fifth embodiment of the inventive concepts.

FIG. 19 is a plan view representing a flow of the mold solution 410 during applying the mold solution 410 in a manufacturing process of a semiconductor package according to the fifth embodiment of the inventive concepts. Referring to FIG. 19, the mold solution 410 may be applied on the lower package substrate 110 by flowing in a direction towards the second edge E2 from the first edge E1, the third edge E3 and the fourth edge E4. A portion of the mold solution 410 may be injected into the chip region CR through the first, second, and third mold injection regions MR1, MR2, and MR3 and fill the space between the lower chip bumps 113 between the lower package substrate 110 and the lower semiconductor chip 120 of the chip region CR. In this case, a flow of the mold solution 410 being injected into the chip region CR through the first, second, and third mold injection regions MR1, MR2, and MR3, and a flow of the mold solution 410 flowing the outside of the lower package substrate 110 on which the lower solder balls 115 are not disposed are similar in speed, and a void occurrence rate in the chip region CR is reduced. A portion of the mold solution 410 injected into the chip region CR may be discharged through the fourth mold injection region MR4 and between the lower solder balls 115 that are adjacent to the second edge E2.

Figure 15A:
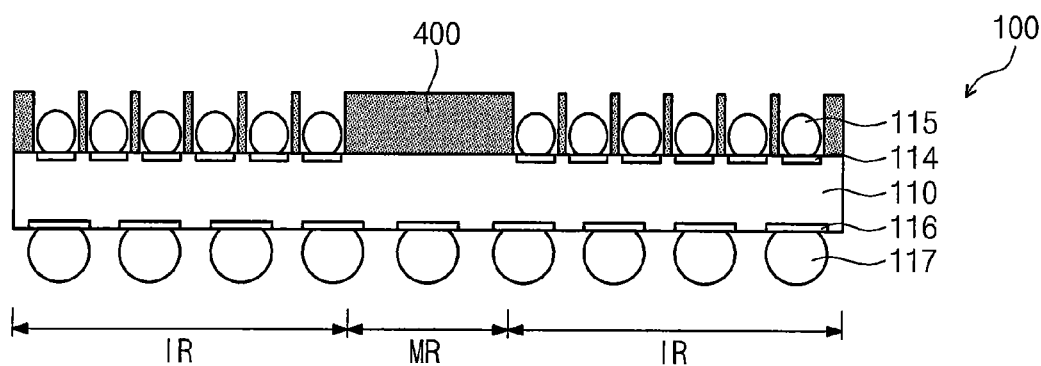
Figure 15B:
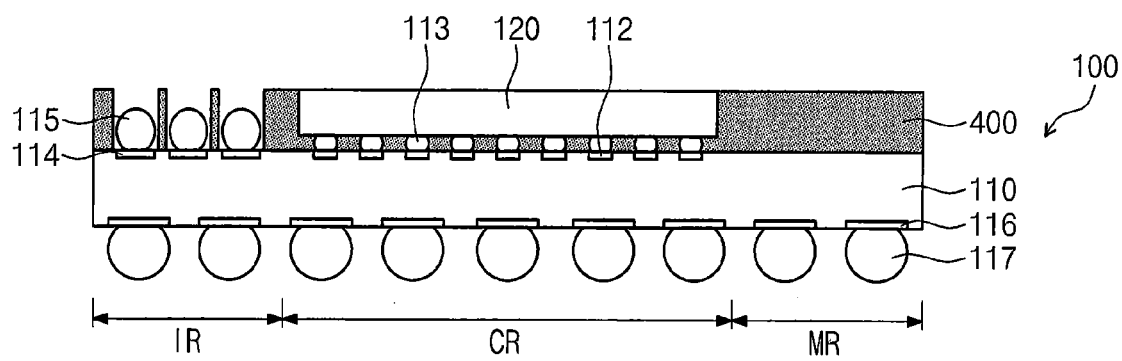

Then, referring to FIGS. 1, 15A and 15B, the lower solder balls 115 may be exposed by laser-drilling the applied mold solution 410.

Figure 16A:
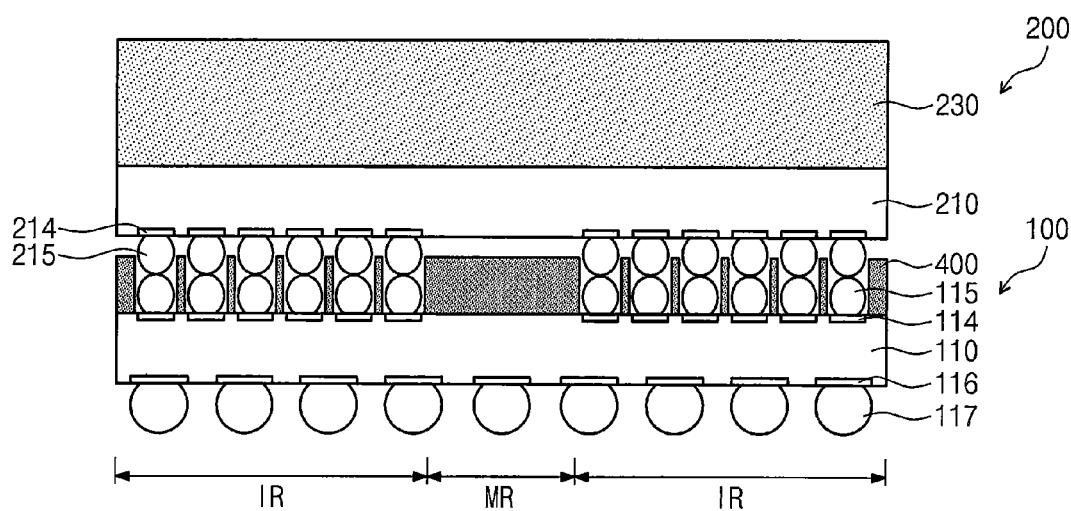
Figure 16B:
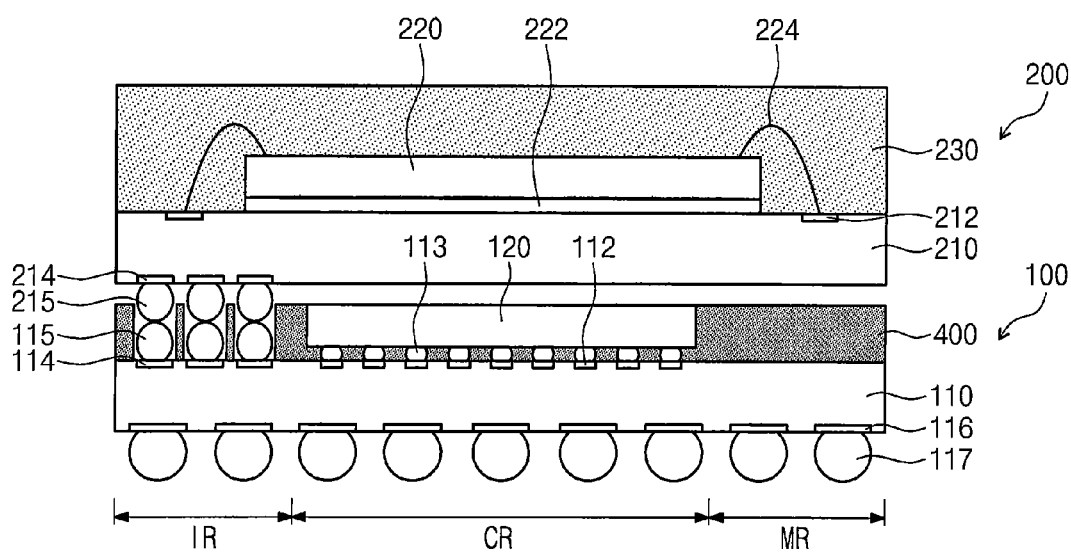

Referring to FIGS. 1, 16A and 16B, the upper package 200 may be provided, which includes the upper package substrate 210, the upper semiconductor chip 220 mounted on the upper package substrate 210, and the upper molding film 230 covering the top surface of the upper package substrate 210 and the upper semiconductor chip 220.

The upper package substrate 210 may be stacked on the lower package 100 and include upper chip pads 212 and upper interconnection pads 214. The upper chip pads 212 may be disposed on the top surface of the upper package substrate 210. The upper interconnection pads 214 may be disposed on the bottom surface of the upper package substrate 210 in order to correspond to the lower interconnection pads 114. Upper solder balls 215 may be provided under the upper interconnection pads 214. For example, the upper interconnection substrate 210 may be a printed circuit board or a flexible printed circuit board.

The upper semiconductor chip 220 may be mounted on the upper package substrate 210 and electrically connected to the upper chip pads 212 through bonding wires 224. An insulating adhesive film 222 may be interposed between the upper semiconductor chip 220 and the upper package substrate 210. The upper semiconductor chip 220 may include a plurality of semiconductor chips, for example a memory device such as DRAM, NAND flash, NOR flash, OneNAND, PRAM, ReRAM, and/or MRAM.

The upper molding film 230 may be formed to cover the top surface of the upper package substrate 210, the upper semiconductor chip 220 and bonding wires 224.

Once the upper package 200 is manufactured, the upper package 200 may be positioned to allow the exposed lower solder balls 115 and the upper solder balls 215 to be correspondingly adjacent to each other.

Figure 17A:
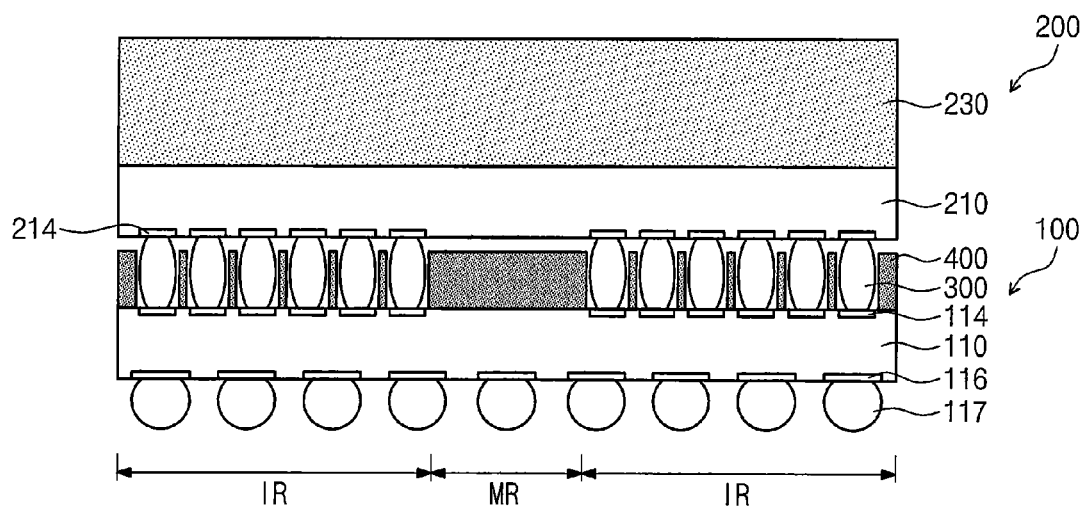
Figure 17B:
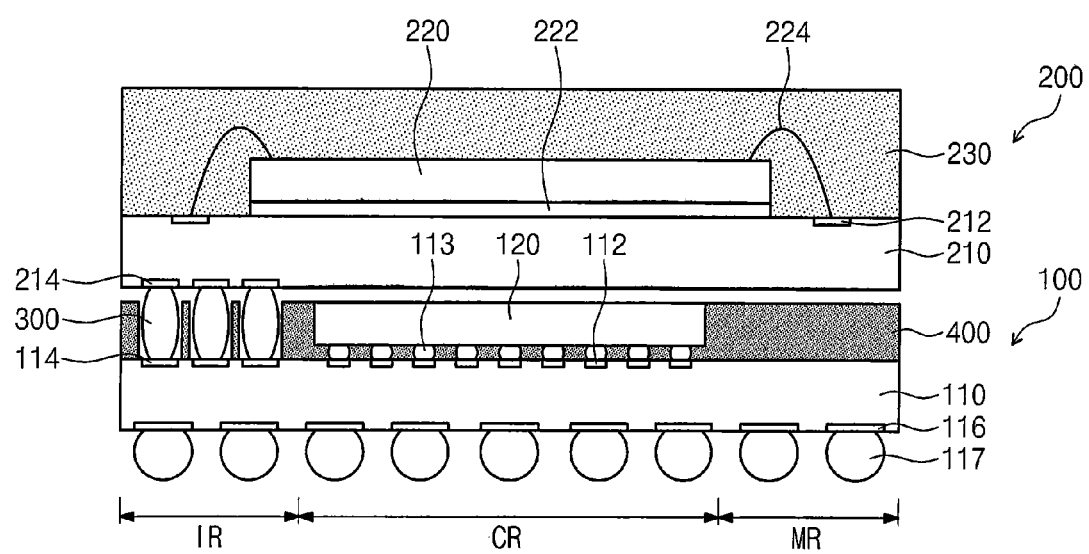

Referring to FIGS. 1, 17A and 17B, the lower solder balls 115 and the upper solder balls 215 are fused or reflowed to form the interconnection terminals 300. The lower package substrate 110 and the upper package substrate 210 may be electrically connected through the interconnection terminals 300. Since the interconnection terminals 300 are formed on the lower interconnection pads 114, the interconnection terminals 300 may be formed on the lower package substrate 110 of the interconnection region IR but may not be formed on the lower package substrate 110 of the mold injection region MR. Accordingly, the interconnection terminals 300 may be arrayed discontinuously by the mold injection region MR.

Typically, during heating process for fusing the solder balls 115 and 215, bending phenomena may occur in the package substrates 110 and 210 and non-wet failure in which some solder balls 115 and 215 are not fused may occur. When the substrates 110 and 210 bend outward (the upper package substrate bends convexly upward and the lower package substrate bend convexly downward), non-wet failure may occur in the solder balls adjacent to the centers of the edges (E1, E2, E3, and/or E4). According to embodiments of the inventive concepts, and, in particular, a method of manufacturing a semiconductor package according to the fifth embodiment, non-wet failure may be reduced since the solder balls don't need to be fused in the mold injection regions MR1, MR2, MR3, and/or MR4 adjacent to the centers of the edges E1, E2, E3, and/or E4.

Figure 20:
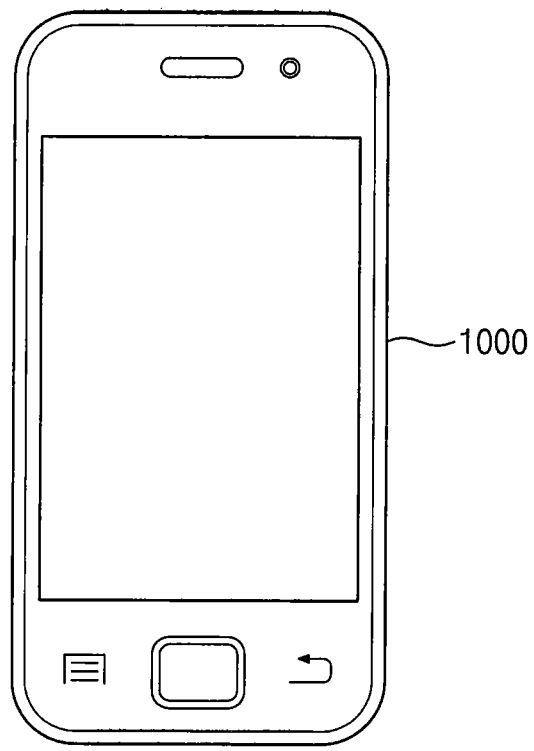
FIG. 20 illustrates an electronic device to which a semiconductor package according to embodiments of the inventive concepts is applied.

FIG. 20 illustrates an electronic device to which a semiconductor package according to embodiments of the inventive concepts is applied.

FIG. 20 illustrates a mobile phone 1000 to which a semiconductor package according to embodiments of the inventive concepts is applied. As another example, the semiconductor package according to embodiments of the inventive concepts may be applied to a smart phone, a personal digital assistant (PDA), a portable multimedia player (PMP), a digital multimedia broadcast (DMB) device, a global positioning system (GPS) device, a handheld gaming console, a portable computer, a web tablet, a wireless phone, a digital music player and/or a memory card and/or all devices that are transmittable and/or receivable information in a wireless environment. Any or all of the semiconductor packages in the device 1000 may be embodied according to the inventive concepts.

Figure 21:
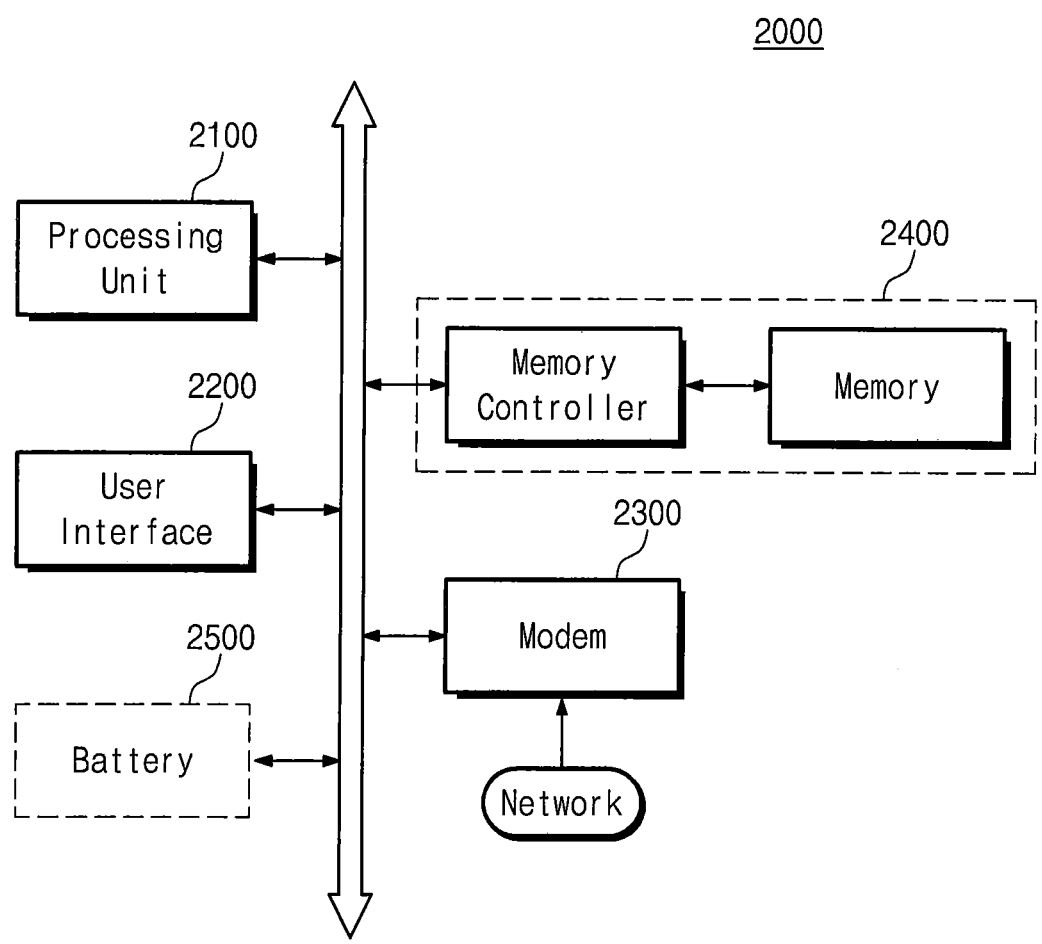
FIG. 21 is a block diagram schematically showing an electronic device to which a semiconductor package according to embodiments of the inventive concepts is applied.

FIG. 21 is a block diagram schematically showing an electronic device to which a semiconductor package according to embodiments of the inventive concepts is applied.

Referring to FIG. 21, an electronic device 2000 according to an example embodiment of the inventive concepts includes a microprocessor 2100, a user interface 2200, a modem 2300 such as a baseband chipset, and a semiconductor package 2400 according to the embodiments of the inventive concepts. Any or all of the other elements 2100, 2200 and/or 2300 may also include a semiconductor package according to the embodiments of the inventive concepts.

When the electronic device according to the inventive concepts is a mobile device, a battery 2500 for providing an operation voltage of the electronic device may be additionally provided. Furthermore, although not shown in the drawing, the electronic device according to the inventive concepts may further include an application chipset and a camera image processor (CIS) etc.

According to a semiconductor package of an embodiment of the inventive concepts, a void occurrence rate in a chip region can be reduced and reliability can be improved.

According to a method of manufacturing a semiconductor package of an embodiment of the inventive concepts, a void occurrence rate in the chip region and a non-wet failure rate can be reduced and reliability and yield can be improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor package comprising:
a lower package comprising a lower semiconductor chip on a lower package substrate;
an upper package comprising an upper package substrate on the lower package and on the lower semiconductor chip opposite the lower package substrate;
interconnection terminals electrically connecting the lower package substrate with the upper package substrate; and
a lower molding film molding the lower semiconductor chip between the lower package substrate and the upper package substrate,
wherein the lower package substrate comprises a chip region between the lower semiconductor chip and the lower package substrate, an interconnection region outside of and enclosing a portion of the chip region, and a mold injection region defined by the chip region and the interconnection region, and
the interconnection terminals are on the lower package substrate of the interconnection region but not on the lower package substrate of the mold injection region,
wherein an interval between the interconnection terminals in one direction is smaller than a width of the mold injection region in the one direction.

2. The semiconductor package of claim 1, wherein the interconnection terminals are discontinuously arrayed by the mold injection region.

3. The semiconductor package of claim 1, wherein the lower semiconductor chip comprises first and second edges facing each other and third and fourth edges perpendicular to the first and second edges and facing each other, and
the mold injection region is disposed adjacent to at least one of the first to fourth edges of the lower semiconductor chip.

4. The semiconductor package of claim 3, wherein the mold injection region comprises first and second mold injection regions separated from each other,
wherein the first and second mold injection regions face each other with the chip region therebetween.

5. The semiconductor package of claim 3, wherein the mold injection region comprises first and second mold injection regions separated from each other,
wherein the first mold injection region is adjacent to the first edge, and the second mold injection region is adjacent to the third edge.

6. The semiconductor package of claim 5, wherein the mold injection region further comprises a third mold injection region separated from the first and second mold injection regions, wherein the third mold injection region is adjacent to the fourth edge.

7. The semiconductor package of claim 6, wherein the mold injection region further comprises a fourth mold injection region separated from the first to third mold injection regions, wherein the fourth mold injection region is adjacent to the second edge.

8. The semiconductor package of claim 3, wherein the mold injection region comprises first and second mold injection regions separated from each other, wherein the first and second mold injection regions are adjacent to any one of the first to fourth edges.

9. A method of manufacturing a semiconductor package, the method comprising:
providing a lower package comprising a lower package substrate, a lower semiconductor chip on the lower package substrate through lower chip bumps, and lower solder balls disposed on the lower package substrate outside the lower semiconductor chip;
forming a lower molding film molding the lower semiconductor chip on the lower package substrate;
providing an upper package comprising an upper package substrate and upper solder balls disposed on a bottom surface of the upper package substrate; and
fusing the lower solder balls and the upper solder balls to form interconnection terminals electrically connecting the lower package substrate with the upper package substrate,
wherein the lower package substrate comprises a chip region on which the lower semiconductor chip is mounted, an interconnection region outside of and enclosing a portion of the chip region, and a mold injection region defined by the chip region and the interconnection region,
the lower solder balls are on the lower package substrate of the interconnection region but are not on the lower package substrate of the mold injection region, and
wherein the lower solder balls are discontinuously arrayed by the mold injection region.

10. The method of claim 9, wherein the forming of the lower molding film comprises:
applying a mold solution to cover the lower chip bumps and the lower solder balls on the lower package substrate; and
laser-drilling the applied mold solution to expose the lower solder balls.

11. The method of claim 9, wherein the lower semiconductor chip comprises first and second edges facing each other, and third and fourth edges perpendicular to the first and second edges and facing each other, and
wherein the mold injection region is adjacent to at least one of the first to fourth edges of the lower semiconductor chip.

12. The method of claim 11, wherein the mold injection region comprises first to third mold injection regions separated from each other, wherein the first mold injection region is adjacent to the first edge, the second mold injection region is adjacent to the third edge, and the third mold injection region is adjacent to the fourth edge, and
wherein the applying of the mold solution comprises injecting the mold solution to the chip region through the first to third mold injection regions.

13. The method of claim 12, wherein the mold injection region further comprises a fourth mold injection region separated from the first to third mold injection regions, wherein the fourth mold injection region is adjacent to the second edge, and
the applying of the mold solution further comprises discharging a portion of the mold solution injected into the chip region to the fourth mold injection region.

14. A semiconductor package comprising:
a first package substrate;
a semiconductor chip on the first package substrate;
a second package substrate on the semiconductor chip opposite the first package substrate; and
an array of interconnection terminals that extend outside and around the semiconductor chip from the first package substrate to the second package substrate;
the array of interconnection terminals including a gap therein that is configured to provide a passageway for mold solution to flow from outside the semiconductor chip to between the semiconductor chip and the first package substrate, wherein the interconnection terminals are discontinuously arrayed by the gap.

15. The semiconductor package of claim 14 wherein the gap in the array of interconnection terminals is further configured to substantially prevent mold solution that flows from outside the semiconductor chip to between the semiconductor chip and the first package substrate in a first direction from also substantially flowing from outside the semiconductor chip to between the semiconductor chip and the first package substrate in a second direction that is opposite the first direction.

16. The semiconductor package of claim 14 wherein the gap in the array of interconnection terminals is further configured to substantially prevent mold solution that flows from outside the semiconductor chip to between the semiconductor chip and the first package substrate in a first direction and perpendicular to the first direction from also substantially flowing from outside the semiconductor chip to between the semiconductor chip and the first package substrate in a second direction that is opposite the first direction.

17. The semiconductor package of claim 14 wherein the gap in the array of interconnection terminals is further configured to prevent formation of a void in the mold solution that flows from outside the semiconductor chip to between the semiconductor chip and the first package substrate.

18. The semiconductor package of claim 14 wherein the first semiconductor chip comprises a plurality of edges and wherein at least one of the edges is devoid of a gap adjacent thereto.

* * * * *